(12) United States Patent
Takahashi

(10) Patent No.: US 6,541,297 B2
(45) Date of Patent: *Apr. 1, 2003

(54) METHOD FOR FABRICATING SEMICONDUCTOR DEVICE AND SEMICONDUCTOR DEVICE

(75) Inventor: Koji Takahashi, Tenri (JP)

(73) Assignee: Sharp Kabushiki Kaisha, Osaka (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/300,877

(22) Filed: Apr. 28, 1999

(65) Prior Publication Data
US 2002/0186736 A1 Dec. 12, 2002

(30) Foreign Application Priority Data

Apr. 28, 1998 (JP) .............................. 10-117951
Feb. 24, 1999 (JP) .............................. 11-046185
Apr. 23, 1999 (JP) .............................. 11-115659

(51) Int. Cl.$^7$ .............................................. H01L 21/00
(52) U.S. Cl. ..................... 438/31; 117/952; 372/50; 372/102; 438/42; 438/43; 438/930; 438/32
(58) Field of Search .......................... 438/43, 31, 42, 438/32, 930; 117/103, 952

(56) References Cited

U.S. PATENT DOCUMENTS

| | | | |
|---|---|---|---|
| 5,347,601 A | * | 9/1994 | Ade et al. ................... 385/3 |
| 5,719,894 A | * | 2/1998 | Jewell et al. ................. 372/45 |
| 6,049,556 A | * | 4/2000 | Sato ............................. 372/46 |
| 6,205,165 B1 | * | 3/2001 | Yamamoto et al. ........... 372/96 |
| 6,207,973 B1 | * | 3/2001 | Sato et al. ..................... 257/98 |
| 6,233,264 B1 | * | 5/2001 | Sato ............................. 372/45 |
| 2001/0006840 A1 | * | 7/2001 | Takahashi ................... 438/483 |

FOREIGN PATENT DOCUMENTS

| JP | 7 66491 | 3/1995 |
|---|---|---|
| JP | 8 271743 | 10/1996 |

OTHER PUBLICATIONS

Kikkawa et al. "Effect or misorientation on characteristics of GainNAs/GaAs QW grown MOVPE" *Extended Abstracts* (*The 59th Autumn Meeting, 1998*); *The Japan Society of Applied Physics.* 248, 15a–YA–9. (1998).

Kohda et al. "Transistion temperature in growth temperature deoendence (sic) of carbon deped (sic) GaAs grown by MOVPE" *Extended Abstracts* (*The 59th Autumn Meeting, 1998*); *The Japan Society of Applied Physics.* 148, 7p–ZE–6.

* cited by examiner

*Primary Examiner*—M. Wilczewski
(74) *Attorney, Agent, or Firm*—Morrison & Foerster LLP

(57) ABSTRACT

The method for fabricating a semiconductor device of this invention includes the step of: forming a first compound semiconductor layer by crystal growth on a surface of a semiconductor substrate which includes a plurality of crystal planes having different orientations exposed due to a concave portion and/or a convex portion formed on the semiconductor substrate, the first compound semiconductor layer containing nitrogen and a V group element other than nitrogen.

26 Claims, 14 Drawing Sheets

PRIOR ART

METHOD FOR FABRICATING SEMICONDUCTOR DEVICE AND SEMICONDUCTOR DEVICE

BACKGROUND OF THE INVENTION

1. Field of the Invention

The present invention relates to a method for fabricating a semiconductor optical integrated device, a method for fabricating a semiconductor laser device, a semiconductor optical integrated device, and a semiconductor laser device.

2. Description of the Related Art

In a semiconductor optical integrated device, a light emitting element (e.g., a semiconductor laser and a light emitting diode), an optical waveguide element (including an optical divider, an optical coupler, a filter, a modulator, and the like), and a light receiving element (e.g., a photodiode) are integrated on one semiconductor substrate. Such a semiconductor optical integrated device is important for realizing a small, inexpensive, highly functional optical device.

A method for forming the above elements monolithically on a semiconductor substrate by one crystal growth step is known. This method is advantageous over a fabrication method in which the respective elements are arranged by alignment, in that since an alignment process is not necessary, production yield improves, the cost can be reduced, and the size of the entire device can be easily reduced.

In a semiconductor optical integrated device, in order to increase the optical coupling efficiency among a light emitting element, an optical waveguide element, and a light receiving element, core layers of the respective elements are preferably positionally aligned to continue in series. Moreover, in order to avoid light emitted from the light emitting element being subjected to excessive absorption loss when the light propagates in the optical waveguide element, the optical waveguide element must be transparent to light emitted from the light emitting element. For this purpose, the forbidden bandwidth of the core layer of the optical waveguide element needs to be wider than that of the core layer (active layer) of the light emitting element.

As a method for fabricating a semiconductor optical integrated device which satisfies the above requirements, partly disordering a core layer composed of a quantum well structure is proposed. For example, Japanese Laid-Open Publication No. 3-89579 discloses a method for integrating a semiconductor laser element having a multiple quantum well (MQW) as an active layer (a distributed feedback (DFB) laser) and an optical waveguide element (an optical modulator) having a disordered MQW as a core layer, as well as a device obtained by this integration method. Hereinbelow, the disclosed method, as well as the construction of the device, will be described with reference to FIGS. 15A to 15C.

First, referring to FIG. 15A, a p-type InGaAsP optical waveguide layer 19, a MQW core layer 14, an n-type InP upper cladding layer 15, and an n-type InGaAsP contact layer 16 are sequentially formed by metal organic vapor phase epitaxy (MOVPE) on a p-type InP substrate 11 on which a diffraction grating 20 is partly formed. The MQW core layer 14 is composed of ten periods of an InGaAs well layer (thickness: 8 nm) and an InGaAsP barrier layer (corresponding to $\lambda_g$=1.3 μm, thickness: 11 nm).

Referring to FIG. 15B, a region M of the resultant structure which is to be a DFB laser is covered with a dielectric film 41 such as an SiO$_2$ film, while in a region N which is to be an optical modulator, sulfur is diffused so as to be distributed from the surface of the contact layer 16 to the core layer 14. The MQW structure of the core layer 14 is destroyed due to the sulfur diffusion, turning the core layer 14 into a disordered layer 42.

Thereafter, referring to FIG. 15C, a buried structure for controlling the transverse mode is formed in the following manner. First, the resultant structure is etched to form a mesa along the center in the length direction of the structure. Fe-doped high-resistance InP buried layers 43 are grown by MOVPE on both sides of the mesa along the length of the structure. Electrodes 17 and 18 are formed on both surfaces of the resultant structure, and then a separation groove 25 is formed by etching to separate the two regions. The resultant wafer is cleaved to obtain the semiconductor optical integrated device as shown in FIG. 15C.

The above conventional fabrication method and construction of the optical integrated device have a feature that the DFB laser region M includes an active layer composed of an MQW structure and the optical modulator region N includes a semiconductor layer in which the same MQW structure is disordered (disordered layer). When a particular impurity is introduced into an MQW structure by diffusion, ion implantation, or the like, the MQW structure is disordered, changing into a bulk semiconductor layer having an average composition of the MQW structure, and thus slightly increasing the forbidden bandwidth. In other words, the optical modulator region N becomes transparent to light emitted from the DFB laser. The optical modulator which is transparent to the laser light allows the light to propagate therein without inducing light loss. Thus, when an electric field is applied to the electrodes of the optical modulator, the laser light propagating in the optical modulator can be modulated with high efficiency.

In the above conventional method for fabricating a semiconductor optical integrated device, the light emitting element, the light receiving element, and the optical waveguide element can be fabricated simultaneously without the necessity of a complicated processing step. In this conventional method, the core layers of the respective elements, i.e., the light emitting layer of the light emitting element, the light absorption layer of the light receiving element, and the optical guide layer of the optical waveguide element, are simultaneously formed by crystal growth as one continuous layer. Accordingly, the semiconductor optical integrated device fabricated by this method has no displacement or seam between the layers and thus provides a large optical coupling efficiency.

The technique of partly disordering a quantum well core layer used in the above conventional method is also utilized in methods for fabricating other types of semiconductor lasers. For example, Y. Suzuki et al., Electronics Letters, Vol.20 (1984) pp.383–384 describes that high output power can be realized for a semiconductor laser having an MQW active layer by introducing impurities only into end faces of the semiconductor laser to disorder the end faces, forming "window-stripes" which do not absorb light.

Japanese Laid-Open Publication No. 7-106697 discloses a gain-coupled distributed feedback semiconductor laser having an absorptive diffraction grating for periodically changing the absorption amount, which is obtained by periodically disordering an absorptive MQW guide layer disposed immediately above an active layer.

Japanese Laid-Open Publication No. 3-49285 discloses a gain-coupled distributed feedback semiconductor laser having a gain diffraction grating for periodically changing the gain of an active layer, which is obtained by periodically disordering the MQW active layer.

In the conventional fabrication method described with reference to FIGS. 15A to 15C, impurities are introduced at a high concentration by a technique such as heat diffusion or combination of ion implantation and annealing.

In such heat diffusion and annealing, a resultant substrate after the completion of crystal growth needs to be kept at a high temperature for an extended period of time. For example, J. J. Coleman et al, Appl. Phys. Lett., Vol.40 (1982) p.904 describes a disordering method by Si ion implantation and annealing at a temperature as high as 675° C. for a period of time as long as four hours. When an p-n junction device such as a semiconductor laser is subjected to such a high-temperature, long-time heat treatment, impurities which should not be diffused, such as impurities doped in a cladding layer during crystal growth, are also diffused. This results in autodoping of impurities to the active layer, thereby greatly reducing the light emitting efficiency. As a result, significant degradation in the characteristics of the semiconductor laser, such as marked increase in operating power and reduction in lifetime, is exhibited.

In view of the foregoing, an object of the present invention is to provide a method for fabricating a semiconductor optical integrated device in which a light emitting element, a light receiving element, and an optical waveguide element are integrated without the necessity of high-temperature heat treatment, as well as the semiconductor optical integrated device fabricated by such a method. In particular, an object of the present invention is to provide a method for fabricating a semiconductor optical integrated device in which a) a high-temperature long-time heat treatment process is not required, b) a light emitting element, a light receiving element, and an optical waveguide element can be simultaneously formed by one crystal growth step without the necessity of complicated processing, and c) a light emitting layer of the light emitting element, a light absorption layer of the light receiving element, and a core layer of the optical waveguide element continue as one layer without any displacement or seam between the layers thus reducing excessive light loss.

Another object of the present invention is to provide a semiconductor optical integrated device in which a light emitting element, a light receiving element, and an optical waveguide element are formed simultaneously.

SUMMARY OF THE INVENTION

The method for fabricating a semiconductor device of this invention includes the step of: forming a first compound semiconductor layer by crystal growth on a surface of a semiconductor substrate which includes a plurality of crystal planes having different orientations exposed due to a concave portion and/or a convex portion formed on the semiconductor substrate, the first compound semiconductor layer containing nitrogen and a V group element other than nitrogen.

In one embodiment of the invention, the step of forming a first compound semiconductor layer includes the step of supplying a material of nitrogen and a material of the V group element other than nitrogen alternately.

In another embodiment of the invention, the step of forming a first compound semiconductor layer includes the step of controlling the composition ratio of nitrogen to the V group element other than nitrogen depending on the difference in the orientation of the crystal planes.

In still another embodiment of the invention, the first compound semiconductor layer comprises a well layer of a quantum well structure.

In still another embodiment of the invention, the V group element other than nitrogen is at least one type selected from the group consisting of arsenic, phosphorus, and antimony.

According to another aspect of the invention, a method for fabricating a semiconductor optical integrated device is provided. The device includes the step of: forming a core layer and an upper cladding layer composed of at least one layer sequentially by crystal growth on a surface of a semiconductor substrate which includes a plurality of crystal planes having different orientations exposed due to a concave portion and/or a convex portion formed on the semiconductor substrate, the core layer including at least one first compound semiconductor layer containing nitrogen and a V group element other than nitrogen.

In one embodiment of the invention, the plurality of crystal planes are selected from planes tilted from (100) plane in an A direction (a [011] direction) by an angle in a range of 0 to 55° and planes crystallographically equivalent to such planes, and an optical waveguide element is formed on a plane having a smaller tilt angle while a light emitting element and/or a light receiving element are formed on a plane having a larger tilt angle.

In another embodiment of the invention, the plurality of crystal planes are selected from planes tilted from (100) plane in a B direction (a [0–11] direction) by an angle in a range of 0 to 55° and planes crystallographically equivalent to such planes, and an optical waveguide element is formed on a plane having a larger tilt angle while a light emitting element and/or a light receiving element are formed on a plane having a smaller tilt angle.

Alternatively, the method for fabricating a semiconductor optical integrated device of this invention includes the steps of: forming at least one set of continuous grooves or mesas on a semiconductor substrate having {100} plane as a principal plane, side walls of the continuous grooves or mesas being made of a plane tilted from (100) plane in an A direction (a [011] direction) by an angle in a range of 0 to 55° or a plane crystallographically equivalent to such a plane, the continuous grooves or mesas having substantially the same depth and different widths; forming a waveguide structure by sequentially forming by crystal growth a lower cladding layer composed of at least one layer, a core layer, and an upper cladding layer composed of at least one layer, the core layer including at least one first compound semiconductor layer containing nitrogen and a V group element other than nitrogen; forming a light emitting element and/or a light receiving element using a portion of the waveguide structure located above the groove or mesa having a smaller width; and forming an optical waveguide element using a portion of the waveguide structure located above the groove or mesa having a larger width.

Alternatively, the method for fabricating a semiconductor optical integrated device of this invention includes the steps of: forming at least one set of continuous grooves or mesas on a semiconductor substrate having {100} plane as a principal plane, side walls of the continuous grooves or mesas being made of a plane tilted from (100) plane in a B direction (a [0–11] direction) by an angle in a range of 0 to 55° or a plane crystallographically equivalent to such a plane, the continuous grooves or mesas having substantially the same depth and different widths; forming a waveguide structure by sequentially forming by crystal growth a lower cladding layer composed of at least one layer, a core layer, and an upper cladding layer composed of at least one layer, the core layer including at least one first compound semiconductor layer containing nitrogen and a V group element other than nitrogen; forming a light emitting element and/or a light receiving element using a portion of the waveguide structure located above the groove or mesa having a larger width; and forming an optical waveguide element using a portion of the waveguide structure located above the groove or mesa having a smaller width.

According to still another aspect of the invention, a method for fabricating a semiconductor laser device is provided. The method includes the step of: forming a lower cladding layer composed of at least one layer, an active layer, and an upper cladding layer composed of at least one layer sequentially on a semiconductor substrate by crystal growth, the active layer including at least one first compound semiconductor layer containing nitrogen and a V group element other than nitrogen, the substrate having a convex portion and/or a concave portion to expose a plurality of crystal planes having orientations different between end face portions and a center portion in a resonator direction.

In one embodiment of the invention, the plurality of crystal planes are at least selected from planes tilted from (100) plane in an A direction (a [011] direction) by an angle in a range of 0 to 55° and planes crystallographically equivalent to such planes, and the crystal plane in the end face portions has a smaller tilt angle while the crystal plane in the center portion has a larger tilt angle.

In another embodiment of the invention, the plurality of different crystal planes are at least selected from planes tilted from (100) plane in a B direction (a [0–11] direction) by an angle in a range of 0 to 55° and planes crystallographically equivalent to such planes, and the crystal plane in the end face portions has a larger tilt angle while the crystal plane in the center portion has a smaller tilt angle.

Alternatively, the method for fabricating a semiconductor laser device of this invention includes the step of: producing an absorptive diffraction grating by forming a diffraction grating made of periodic concave and convex portions in the vicinity of an active layer and forming at least one first compound semiconductor layer containing nitrogen and a V group element other than nitrogen above the diffraction grating so that the concave and convex portions of the diffraction grating are traced.

Alternatively, the method for fabricating a semiconductor laser device of this invention includes the step of: producing a gain diffraction grating by forming a diffraction grating made of periodic concave and convex portions and forming at least one first compound semiconductor layer containing nitrogen and a V group element other than nitrogen above the diffraction grating so that the concave and convex portions of the diffraction grating are traced.

Alternatively, the method for fabricating a semiconductor optical integrated device of this invention includes the step of: fabricating a semiconductor laser device by the method according to the present invention as a semiconductor laser element, simultaneously with other elements constituting the semiconductor optical integrated device.

According to still another aspect of the invention, a semiconductor optical integrated device is provided. The device is a semiconductor device fabricated by the method according to the present invention, including at least a light emitting element and/or a light receiving element and an optical waveguide element which are integrated on one substrate, wherein both a core layer of the light emitting element and/or the light receiving element and a core layer of the optical waveguide element include the first compound semiconductor layer, and a nitrogen mole fraction of the first compound semiconductor layer is larger in the light emitting element and/or the light receiving element than in the optical wavelength element.

In one embodiment of the invention, the light emitting element and/or the light receiving element and the optical waveguide element are formed on a substrate having planes selected from planes tilted from (100) plane in an A direction (a [011] direction) by an angle in a range of 0 to 55° and planes crystallographically equivalent to such planes, the light emitting element and/or the light receiving element being formed on one of the planes having a larger tilt angle and the optical waveguide element being formed on another of the planes having a smaller tilt angle.

In another embodiment of the invention, the light emitting element and/or the light receiving element and the optical waveguide element are formed on a substrate having planes selected from planes tilted from (100) plane in a B direction (a [0–11] direction) by an angle in a range of 0 to 55° and planes crystallographically equivalent to such planes, the light emitting element and/or the light receiving element being formed on one of the planes having a smaller tilt angle and the optical waveguide being formed on another of the planes having a larger tilt angle.

According to still another aspect of the invention, a semiconductor laser device is provided. The device is a semiconductor device fabricated by the method according to the present invention, wherein an active layer of the semiconductor laser device includes the first compound semiconductor layer, and a nitrogen mole fraction of the first compound semiconductor layer is larger in an end face portion of a resonator than in the center portion of the resonator in the resonator direction.

In one embodiment of the invention, the semiconductor laser device is formed on a substrate having planes selected from planes tilted from (100) plane in an A direction (a [011] direction) by an angle in a range of 0 to 55° and planes crystallographically equivalent to such planes, and the center portion of the first compound semiconductor layer is formed on one of the planes having a larger tilt angle while the end face portion of the first compound semiconductor layer is formed on another of the planes having a smaller tilt angle.

In another aspect of the invention, the semiconductor laser device is formed on a surface of a substrate having planes selected from planes tilted from (100) plane in a B direction (a [0–11] direction) by an angle in a range of 0 to 55° and planes crystallographically equivalent to such planes, and the center portion of the first compound semiconductor layer is formed on one of the planes having a smaller tilt angle while the end face portion of the first compound semiconductor layer is formed on another of the planes having a larger tilt angle.

Alternatively, the semiconductor laser device of the present invention is a semiconductor device fabricated by the method according to the present invention, wherein the first compound semiconductor layer is formed on a diffraction grating made of periodic concave and convex portions formed in the vicinity of an active layer, the first compound semiconductor layer tracing the concave and convex portions, a nitrogen mole fraction of the first compound semiconductor layer periodically changes in correspondence with the periodic concave and convex portions of the diffraction grating, and portions of the first compound semiconductor layer having a larger nitrogen mole fraction absorb light from the active layer, to establish an absorptive diffraction grating which generates periodic modulation of gain.

Alternatively, the semiconductor laser device is a semiconductor device fabricated by the method according to the present invention, wherein the first compound semiconductor layer is formed on a diffraction grating made of periodic concave and convex portions, the first compound semiconductor layer tracing the concave and convex portions, and a nitrogen mole fraction of the first compound semiconductor layer periodically changes in correspondence with the periodic concave and convex portions of the diffraction grating, to generate periodic modulation of a gain of the active layer.

Hereinbelow, the function of the present invention will be described.

The fabrication method of the present invention utilizes the principle that the nitrogen mole fraction of the first compound semiconductor layer slightly changes depending on the base crystal plane and this slight change of the nitrogen mole fraction largely changes the forbidden bandwidth. Utilizing this principle, it is possible to form portions having different forbidden bandwidths by one crystal growth step without the necessity of heat treatment. This function can be obtained by controlling the nitrogen mole fraction based on the base crystal plane.

The change in the nitrogen mole fraction depending on the base crystal plane is intensified by supplying V group materials alternately. This allows for obtaining the above function more effectively.

The first compound semiconductor layer constitutes the well layer of the quantum well structure. A distribution is generated in a lattice constant in correspondence with the distribution of the N mole fraction. However, the well layer is so thin that it can have a distortion inside and thus no lattice defect is generated due to the lattice constant distribution.

A large change in the forbidden bandwidth is obtained by a slight change in the nitrogen mole fraction by selecting at least one type of element from the group consisting of arsenic, phosphorus, and antimony, as an element to be mixed together with nitrogen. This allows for obtaining a crystal suitable for realizing the device according to the present invention.

By utilizing the principle that the nitrogen mole fraction of the first compound semiconductor layer slightly changes depending on the base crystal plane and this slight change of the nitrogen mole fraction largely changes the forbidden bandwidth, it is possible to form a plurality of waveguide structures having different forbidden bandwidths in the core layer by one crystal growth step without the necessity of heat treatment.

A semiconductor laser device having window structures at end faces can be easily obtained by forming by crystal growth a compound semiconductor layer containing nitrogen and a V group element other than nitrogen on a substrate having a plurality of planes with different orientations exposed thereon.

A semiconductor laser device having an absorptive periodic structure and a semiconductor laser device having a gain periodic structure can be easily obtained by forming by crystal growth a compound semiconductor layer containing nitrogen and a V group element other than nitrogen as components on a substrate having a plurality of planes with different orientations exposed thereon.

According to the present invention, the structure having a forbidden bandwidth distribution can be formed by one crystal growth step without the necessity of heat treatment. This allows for fabricating devices having excellent characteristics by a reduced number of fabrication steps.

The forbidden bandwidth distribution can be intensified by forming portions having slightly different nitrogen mole fractions. According to the present invention, the compound semiconductor layer containing nitrogen and a V group element other than nitrogen is used as the core layer of the semiconductor optical integrated device, and the forbidden bandwidth of the light emitting element and/or the light receiving element is made larger than that of the optical waveguide element. By this setting, therefore, light emitted from the light emitting element can propagate through the optical waveguide element with low light loss and can be absorbed by the light receiving element with good efficiency.

According to the present invention, a large forbidden bandwidth distribution can be obtained by slightly changing the nitrogen mole fraction. Therefore, it is suitable for the semiconductor laser device to form the compound semiconductor layer containing nitrogen and a V group element other than nitrogen so that the nitrogen mole fraction is slightly different between the portions thereof at the end faces and the portion thereof in the center.

According to the present invention, a large forbidden bandwidth distribution can be obtained by slightly changing the nitrogen mole fraction. Therefore, it is suitable for the semiconductor laser device to use the portions having slightly different nitrogen mole fractions of the compound semiconductor layer containing nitrogen and a V group element other than nitrogen as an absorption periodic modulation structure or a gain periodic modulation structure.

Thus, the invention described herein makes possible the advantages of (1) providing a method for fabricating a semiconductor optical integrated device in which a light emitting element, a light receiving element, and an optical waveguide element are easily integrated without the necessity of high-temperature heat treatment, (2) providing a semiconductor optical integrated device fabricated by such a method, (3) providing a method for fabricating a semiconductor optical integrated device in which a) a high-temperature long-time heat treatment process is not required, b) a light emitting element, a light receiving element, and an optical waveguide element can be simultaneously formed by one crystal growth step without the necessity of complicated processing, and c) a light emitting layer of the light emitting element, a light absorption layer of the light receiving element, and a core layer of the optical waveguide element continue as one layer without any displacement or seam between the layers thus reducing excessive light loss, and (4) providing a semiconductor optical integrated device in which a light emitting element, a light receiving element, and an optical waveguide element are formed together simultaneously.

The present invention is also applicable to methods for fabricating an end face window structure type semiconductor laser, a gain-coupled distributed feedback semiconductor laser provided with an absorptive diffraction grating, and a gain-coupled distributed feedback semiconductor laser provided with a gain diffraction grating.

These and other advantages of the present invention will become apparent to those skilled in the art upon reading and understanding the following detailed description with reference to the accompanying figures.

BRIEF DESCRIPTION OF THE DRAWINGS

FIGS. 2A to 2C are cross-sectional views of the semiconductor optical integrated device of Embodiment 1, wherein FIG. 2A is a cross-sectional view taken along line m-m' of FIG. 1B, FIG. 2B is a cross-sectional view taken along line n-n' of FIG. 1B, and FIG. 2C is an enlarged cross-sectional view of areas X shown in FIGS. 2A and 2B;

FIGS. 8A to 8D are views illustrating a semiconductor optical integrated device of Embodiment 2 according to the present invention, wherein FIG. 8A is a perspective view of a substrate, FIG. 8B is a cross-sectional view of a layered structure formed in a region M shown in FIG. 8A, taken along line m-m' of FIG. 8A, FIG. 8C is a cross-sectional view of a layered structure formed in a region N shown in FIG. 8A, taken along line n-n' of FIG. 8A, and FIG. 8D is an enlarged view of areas X shown in FIGS. 8B and 8C;

FIGS. 9A to 9D are views illustrating a semiconductor optical integrated device of Embodiment 3 according to the present invention, wherein FIG. 9A is a perspective view of a substrate, FIG. 9B is a cross-sectional view of a layered structure formed in a region M shown in FIG. 9A, FIG. 9C is a cross-sectional view of a layered structure formed in a region N shown in FIG. 9A, and FIG. 9D is an enlarged view of areas X shown in FIGS. 9B and 9C;

FIGS. 10A to 10D are views illustrating a semiconductor optical integrated device of Embodiment 4 according to the present invention, wherein FIG. 10A is a perspective view of a substrate, FIG. 10B is a cross-sectional view of a layered structure formed in a region M shown in FIG. 10A, FIG. 10C is a cross-sectional view of a layered structure formed in a region N shown in FIG. 10A, and FIG. 10D is an enlarged view of areas X shown in FIGS. 10B and 10C;

DESCRIPTION OF THE PREFERRED EMBODIMENTS (Embodiment 1)

Figure 1A:
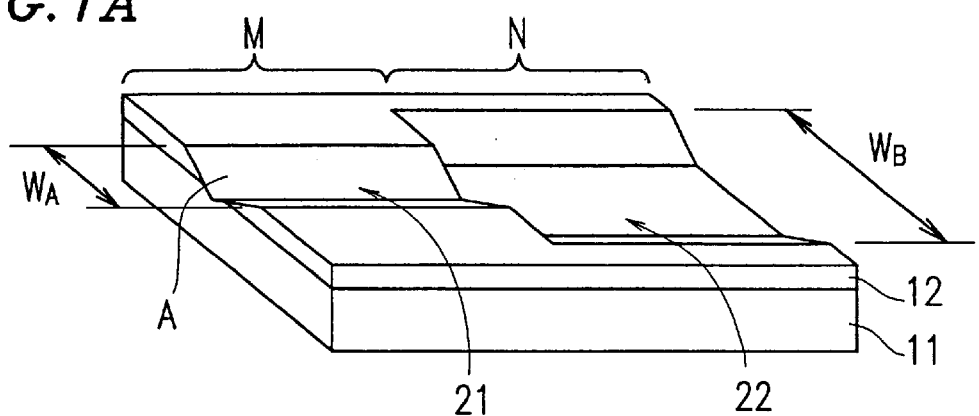
FIGS. 1A to 1C are perspective views illustrating a fabrication process of a semiconductor optical integrated device of Embodiment 1 according to the present invention.
Figure 1B:
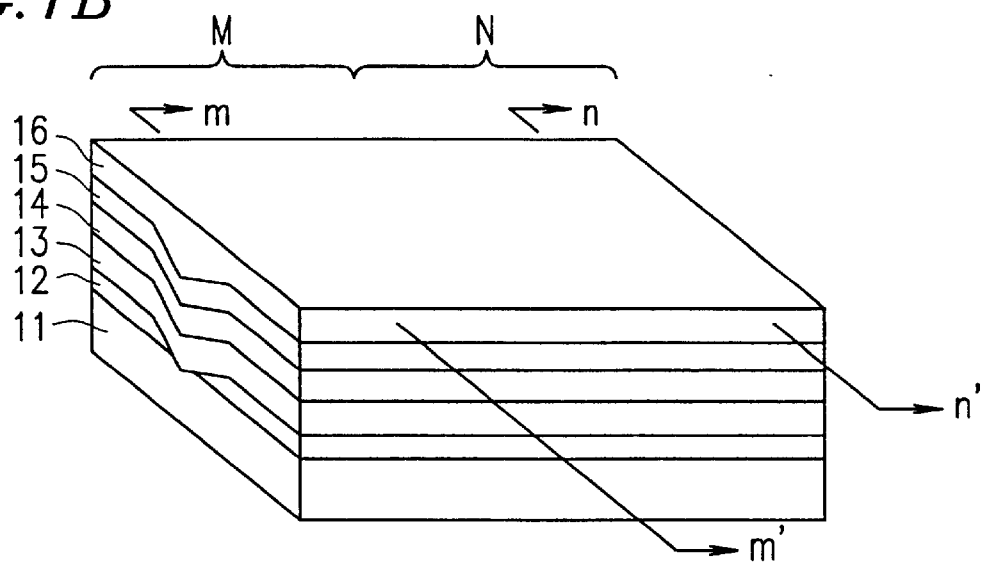
Figure 1C:
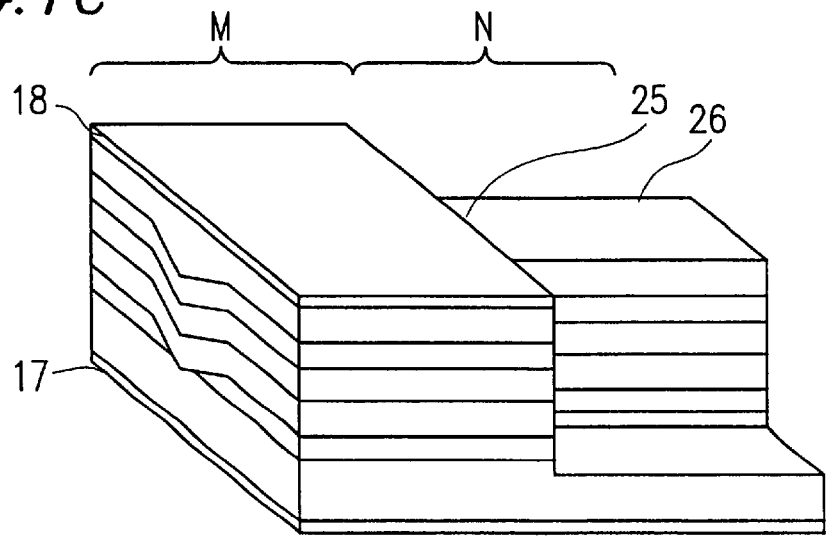

Referring to FIGS. 1A to 1C, a method for fabricating a semiconductor optical integrated device of Embodiment 1 according to the present invention will be described. In the fabrication method, a semiconductor laser element and an optical waveguide element are integrated on one substrate. The semiconductor laser element includes an active layer of a multiple quantum well (MQW) structure having a GaInNAs well layer.

A feature of the present invention is that a waveguide structure including an active layer/core layer partly made of GaInNAs is formed on a substrate which has two different types of grooves of which side walls are an A plane. As used herein, the "A plane" is defined as a generic name of planes obtained by tilting (100) plane in a [011] direction (an A plane direction) by an angle in the range of 0 to 55° and planes crystallographically equivalent to such planes. For example, a plane tilted in the [011] direction from (100) plane by about 25° and planes crystallographically equivalent to such a plane are denoted as {311} A plane. A plane tilted in the [011] direction from (100) plane by about 55° and planes crystallographically equivalent to such a plane are denoted as {111} A plane. As used herein, the "A direction" or "{111} A plane direction" is defined as a generic name of a direction in which (100) plane is tilted to obtain the A plane, such as the [011] direction with respect to (100) plane, and directions crystallographically equivalent to such a direction. Likewise, the "B plane" is defined as a generic name of planes obtained by tilting (100) plane in a [0–11] direction by an angle in the range of 0 to 55° and planes crystallographically equivalent to such planes. For example, a plane tilted in the [0–11] direction from (100) plane by about 25° and planes crystallographically equivalent to such a plane are denoted as {311} B plane. A plane tilted in the [0–11] direction from (100) plane by about 55° and planes crystallographically equivalent to such a plane are denoted as {111} B plane. A "B direction" or "{111} B plane direction" is defined as a generic name of a direction in which (100) plane is tilted to obtain the B plane, such as the [0–11] direction with respect to (100) plane, and directions crystallographically equivalent to such a direction. Herein, a (hk1) plane and planes crystallographically equivalent to the (hk1) plane are generically denoted as {hk1} plane.

Hereinbelow, the fabrication method and the construction of the semiconductor optical integrated device of this embodiment will be described in detail.

First, referring to FIG. 1A, p-type GaAs is grown on a (100) plane surface of a low-resistance n-type GaAs substrate to a thickness of about 0.5 μm by molecular beam epitaxy (MBE) to form a current-narrowing layer 12. Thereafter, two grooves are formed on the resultant structure by patterning using a normal photolithographic technique and wet etching using a mixed etchant of hydrochloric acid, a hydrogen peroxide solution, and super pure water. More specifically, a groove 21 having a narrow V-shape bottom is formed in a region M and a groove 22 having a wide flat bottom is formed in a region N, as shown in FIG. 1A. In this embodiment, referring to FIG. 1A, a width $W_A$ is about 4 μm, a width $W_B$ is about 10 μm, and the depth of the grooves is about 1 μm. The tilted side walls of the grooves 21 and 22 along the length of the device are {311} A plane.

Figure 2A:
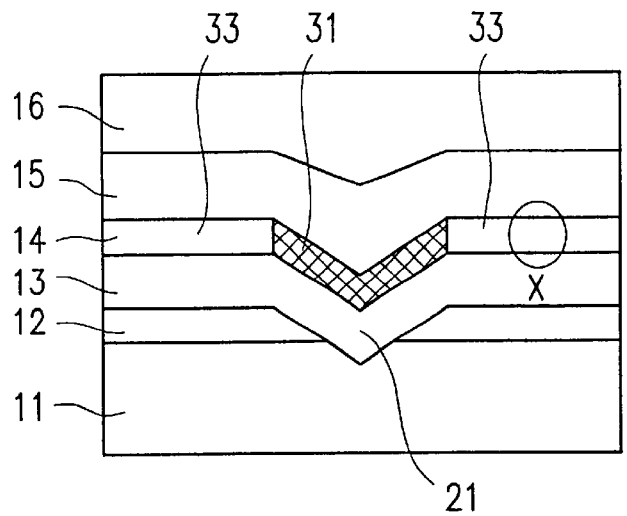
Figure 2B:
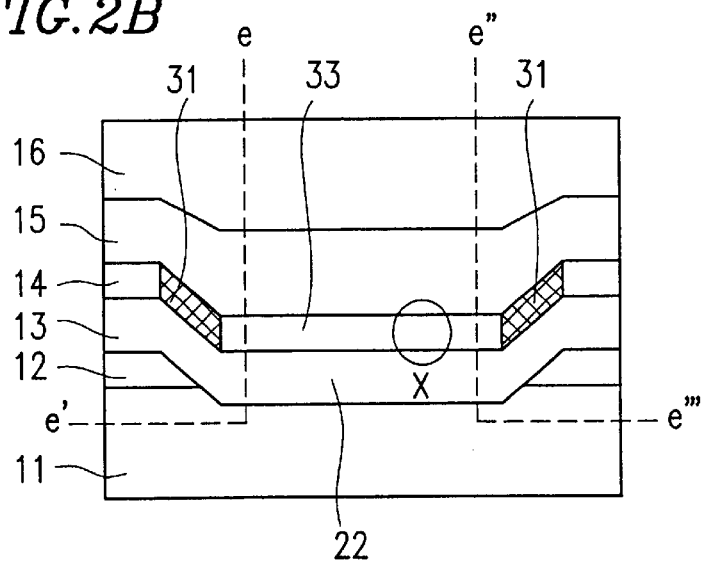
Figure 2C:
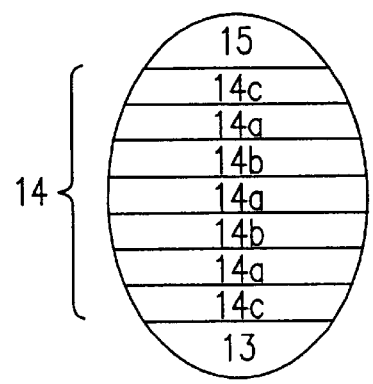
Figure 3A:
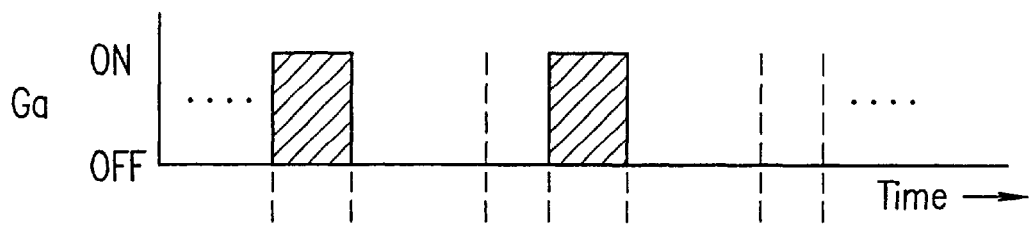
FIGS. 3A to 3D are timing charts of crystal growth of an GaInNAs layer in Embodiment 1 according to the present invention.
Figure 3B:
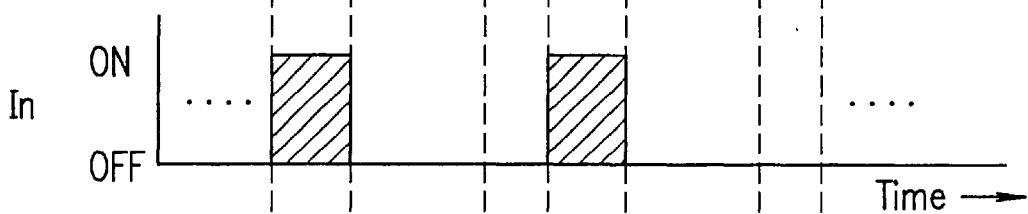
Figure 3C:
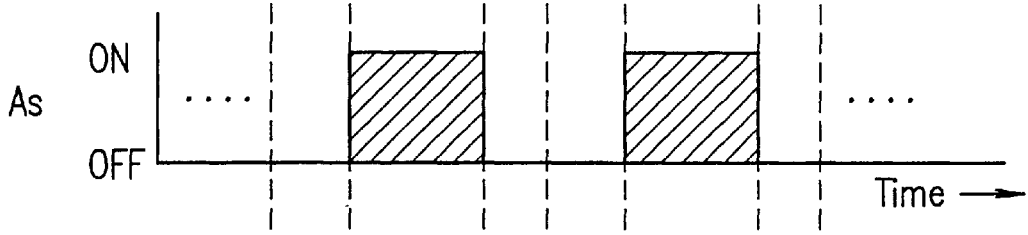
Figure 3D:
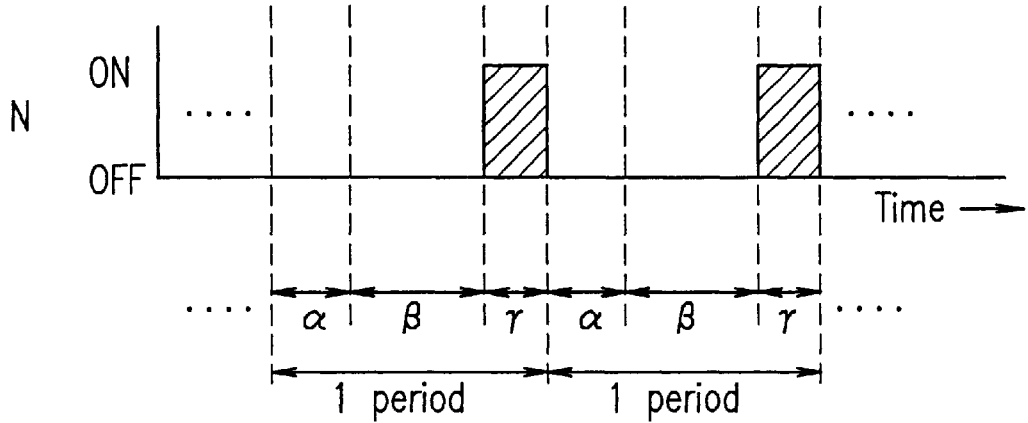

On the thus-processed substrate, layers constituting a waveguide structure as shown in FIG. 1B are formed by crystal growth. FIGS. 2A and 2B show sections of the waveguide structure taken along lines m-m' and n-n' in FIG. 1B, respectively, and FIG. 2C shows an enlarged section of areas X shown in FIGS. 2A and 2B. The material and thickness (measured at a flat portion) of each layer of the waveguide structure are as follows.

Lower cladding layer 13: n-type $Al_{0.4}Ga_{0.6}As$ (thickness: 0.2 $\mu$m)

Active layer 14 (triple quantum well)

Well layer 14a: undoped $Ga_{0.935}In_{0.065}N_yAs_{1-y}$ (thickness: 8 nm)

Barrier layer 14b: undoped $Al_{0.1}Ga_{0.9}As$ (thickness: 10 nm)

Guide layer 14c: undoped $Al_{0.1}Ga_{0.9}As$ (thickness: 30 nm)

Upper cladding layer 15: p-type $Al_{0.4}Ga_{0.6}As$ (thickness: 1 $\mu$m)

Contact layer 16: $p^+$-type GaAs (thickness: 0.5 $\mu$m)

The above crystal growth is performed at a growth temperature of 600° C. by MBE using respective solid materials for Ga, Al, In, and As sources and ammonia gas ($NH_3$) for an N source. The crystal growth of GaInNAs for the well layers 14a is performed by supplying the V group materials alternately according to a sequence shown in FIGS. 3A to 3D. More specifically, first, at step α, the Ga and In sources are supplied so that the total thickness corresponds to the thickness of a one-atom layer, to form a III group end face. Subsequently, at step β, a sufficient amount of the As source is supplied to form an As end face. During this As supply, As atoms are adsorbed to the surface of the crystal forming a one-atom layer and excessive As atoms are evaporated. At step γ, the N source is supplied for a fixed time, to replace part of the As atoms adsorbed to the outermost surface of the crystal with N atoms. The crystal growth of one-molecular layer of GaInNAs mixed crystal is completed in one period of these three steps. By repeating the series of these steps, a GaInNAs crystal having a desired thickness is obtained.

As shown in FIG. 1C, a separation groove 25 having a width of about 2 $\mu$m is formed between the regions M and N by photolithographic masking and dry etching. The separation groove 25 also serves as one Fabry-Perot mirror of a semiconductor laser in the region M. A counterpart Fabry-Perot mirror may be formed by dry etching similarly, or may be formed by cleaving. Subsequently, the region N is partly removed by dry etching, leaving only the center portion thereof to form a stripe-shaped waveguide 26 having a width of about 4 $\mu$m. The outer portions should be removed to obtain the substrate 11 as shown by the dotted lines e-e' and e"-e"' in FIG. 2B. Finally, an n-side electrode 17 and a p-side electrode 18 are formed by evaporation on the region M which is to be the semiconductor laser element, thereby to complete the semiconductor optical integrated device of this embodiment.

A feature of the present invention in the above-described process of forming the GaInNAs well layers 14b of the MQW structure is as follows. At step γ, the amount of N atoms replacing the As atoms on the outermost surface of the crystal to be taken into the crystal is largely affected by the orientation of a surface of the substrate on which the crystal growth is performed, in addition to the rate of supply and amount of the N source. More specifically, in the case where crystal growth is performed on a surface of a substrate tilted in the A plane direction, since As atoms located on the tilted surface are bonded with Ga atoms via a single bond, the As atoms are more easily replaced with N atoms, compared with the case where crystal growth is performed on (100) plane of the substrate. On the contrary, in the case where crystal growth is performed on a surface of a substrate tilted in the B plane direction, since As atoms located on the tilted surface is bonded with Ga atoms via triple bonds, the As atoms are less easily replaced with N atoms, compared with the case where crystal growth is performed on (100) plane of the substrate. Incidentally, in the case where crystal growth is performed on (100) plane of the substrate which is not tilted in either direction, As atoms are bonded with Ga atoms via double bonds.

Accordingly, a larger amount of N atoms replace As atoms to be taken into the growth layer at step γ when a substrate having an orientation tilted in the A plane direction is used, resulting in a GaInNAs crystal having a larger N mole fraction.

Figure 4:
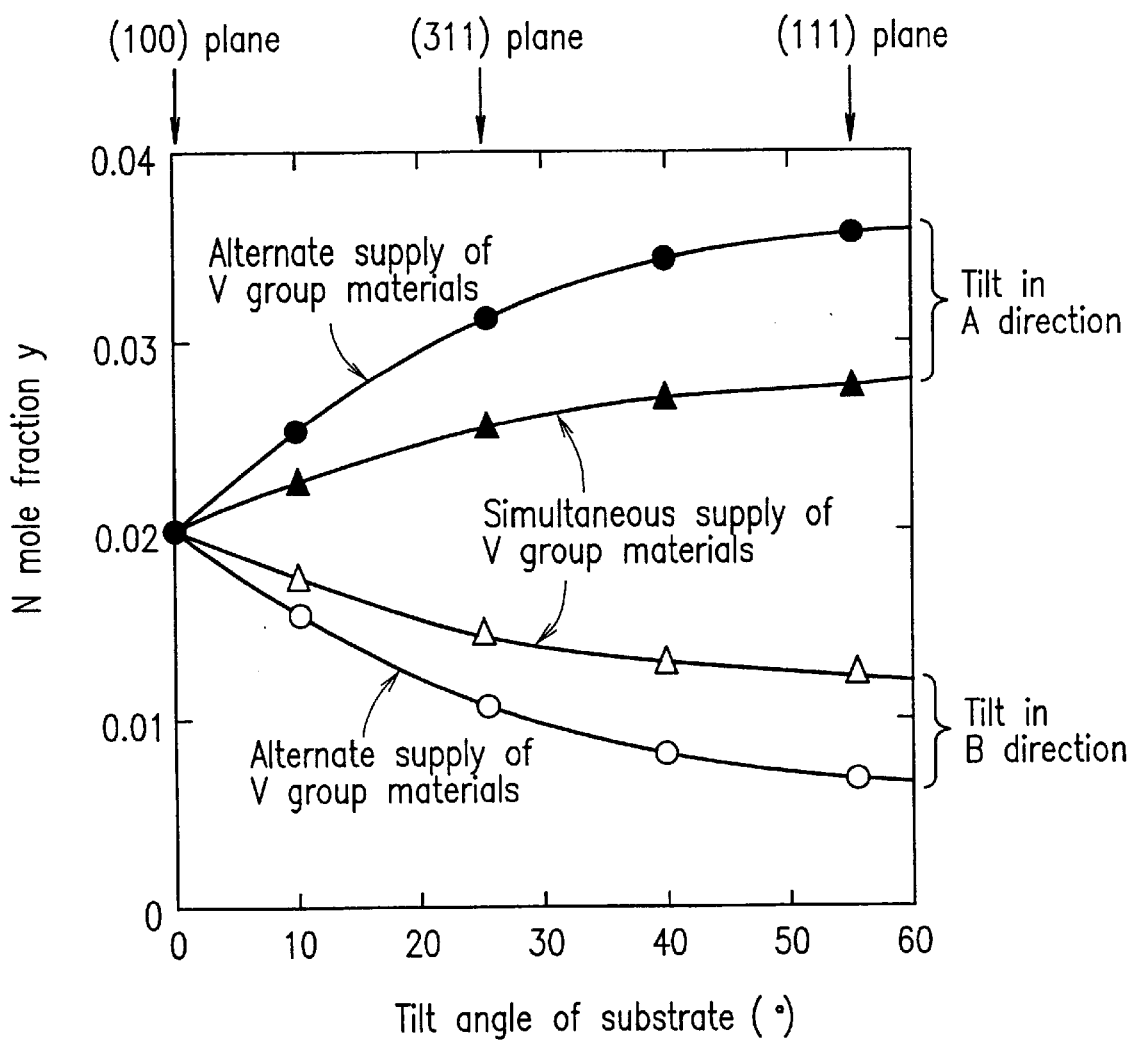
FIG. 4 is a graph showing the dependency of the N mole fraction of the GaInNAs layer on the substrate tilt angle.

FIG. 4 shows the relationships between the N mole fraction and the tilt direction or angle from (100) plane of the GaAs substrate observed during the crystal growth of GaInNAs. In FIG. 4, two cases are shown where the V group materials are supplied alternately as in this embodiment and where all the material are supplied simultaneously. The difference in the N mole fraction is observed even in the case where all the materials are supplied simultaneously, due to the difference in the amount of N atoms taken into the growth layer depending on the orientation of the substrate. However, the difference in the N mole fraction depending on the orientation of the substrate is more apparent in the case where the V group materials are supplied alternately to effect the crystal growth while replacing As atoms on the surface with N atoms. The latter case is therefore more preferable.

On the GaAs (100) substrate processed as shown in FIG. 1A, {311} A plane is exposed on the side walls of the grooves along the length thereof, in addition to the principal (100) plane. When materials including As and N as V group elements are to be grown on such a substrate, a larger amount of As atoms tend to be replaced with N atoms in a portion on {311} A plane than in a portion on the principal (100) plane. This results in a slight increase in the N mole fraction in the portion on {311} A plane. More specifically, in the GaInNAs crystal of the well layer in MQW portions 31 shown in FIGS. 2A and 2B formed on {311} A plane, the N mole fraction (y) is as large as about 0.027, and the forbidden bandwidth of the MQW is about 0.95 eV (corresponding to a wavelength of about 1.31 $\mu$m). On the contrary, the N mole fraction (y) of the GaInNAs crystal in MQW portions 33 formed on the principal (100) plane is as small as about 0.018, and the forbidden bandwidth is about 1.08 eV (corresponding to a wavelength of about 1.15 $\mu$m).

A distribution is generated in a lattice constant in correspondence with the distribution of the N mole fraction. However, crystal defect will not be induced from such lattice constant distribution since the thickness of the GaInNAs layer is smaller than a critical film thickness. The GaInNAs layer on the A plane receives a tension distortion of about 0.1% against the substrate, while the GaInNAs layer on (100) plane receives a compression distortion of about 0.1% against the substrate. When the MQW portion 31 in FIG. 2A is used as the active layer of the semiconductor laser which oscillates at a wavelength of 1.3 $\mu$m, and thus the MQW portion 33 in FIG. 2B is used as the core layer of the optical waveguide, light emitted from the semiconductor laser is allowed to propagate through the optical waveguide without being absorbed by the optical waveguide.

The semiconductor optical integrated device according to the present invention has a feature as follows. Part of As atoms of GaInAs (several percent or less) are replaced with N atoms to obtain GaInNAs mixed crystal as described above. By this addition of N to the crystal, the resultant forbidden bandwidth becomes markedly narrowed.

Figure 5:
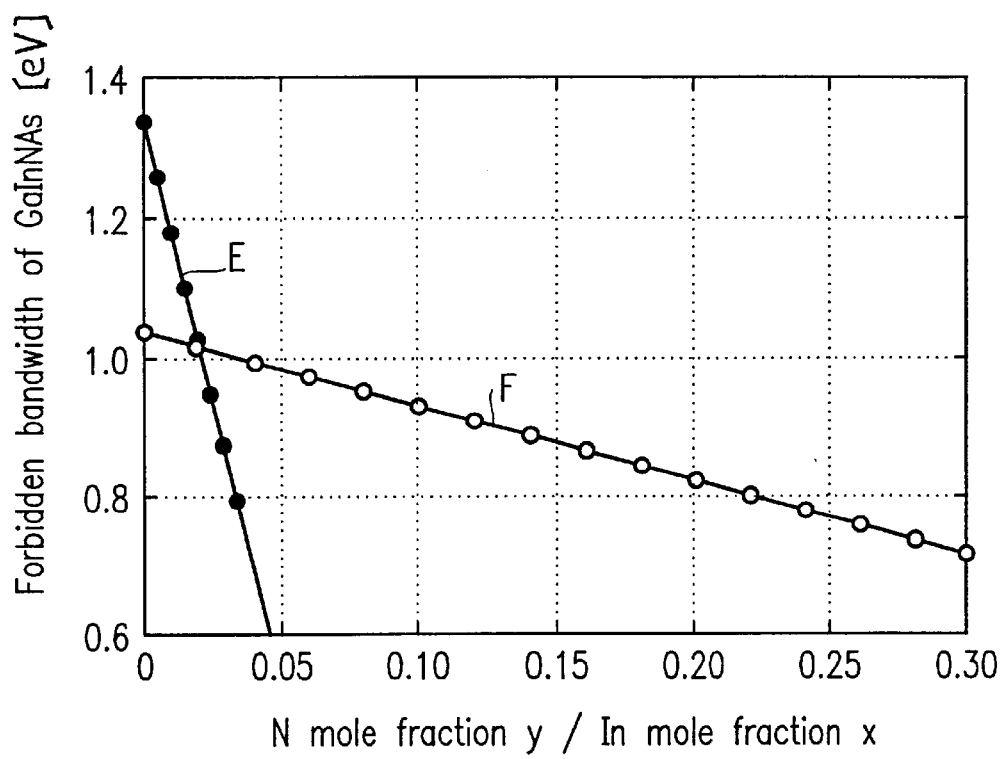
FIG. 5 is a graph showing the dependencies of the forbidden bandwidth on the N mole fraction and In mole fraction of the GaInNAs layer, wherein line E represents the dependency on the N mole fraction (y) when the In mole fraction (x) is fixed at 0.08, and line F represents the dependency on the In mole fraction (x) when the N mole fraction (y) is fixed at 0.02.

FIG. 5 shows the relationship between the mole fraction and the forbidden bandwidth. A line E represents a change in the forbidden bandwidth observed when the N mole fraction (y) is varied while the In mole fraction (x) is fixed (x=0.08). A line F represents a change in the forbidden bandwidth observed when the In mole fraction (x) is varied while the N mole fraction (y) is fixed (y=0.025). It is observed from this graph that, while the change in the forbidden bandwidth (eV) with respect to the In mole fraction (x) is about −1.1 (eV/x), the change in the forbidden bandwidth (eV) with respect to the N mole fraction (y) is about −15.5 (eV/y), which is larger by ten times or more than the change with respect to the In mole fraction. This indicates that the forbidden bandwidth can be greatly changed by only forming areas having slightly different N mole fractions.

Thus, the above construction is suitable for a semiconductor optical integrated device for a 1.3 $\mu$m or 1.55 $\mu$m wavelength band, where a semiconductor laser and an optical waveguide are formed on one substrate simultaneously. That is, if both the active layer of the semiconductor laser and the core layer of the optical waveguide are made of the same quantum well structure including a GaInNAs well layer, these layers can be formed by only slightly changing the N mole fraction.

A current is applied to the semiconductor laser region of the thus-fabricated optical integrated device via the n-side electrode 17 and the p-side electrode 18. The current is narrowed by the current-narrowing layer 12 and then flows into the V-shaped portion of the active layer, to realize laser oscillation having a threshold current of 10 mA and a wavelength of 1.3 $\mu$m. Since a conventional long-time high-temperature heat treatment is not required, no degradation in the device characteristics, such as an increase in the threshold current, is observed, compared with an independent semiconductor laser device having a similar configuration.

The core layer of the optical waveguide is formed on (100) plane while the active layer of the semiconductor laser is formed on a plane tilted in the A plane direction as described above. As a result, the optical waveguide is transparent to light emitted from the semiconductor laser, allowing the light to propagate through the optical waveguide without being excessively absorbed or scattered. The propagating light is efficiently retrieved at the other end face of the optical waveguide located away from the semiconductor laser. Since the light emitting layer of the light emitting element and the optical guide layer of the optical waveguide element are simultaneously grown as one continuous layer, no displacement or seam between the layers is observed, and excessive light loss or scattering is scarcely observed.

In this embodiment, the semiconductor optical integrated device including one semiconductor laser element and one optical waveguide element was described. Some alterations can also be made.

As the first alteration, a semiconductor optical integrated device in which a light receiving element is additionally integrated on the same substrate will be described.

Figure 6:
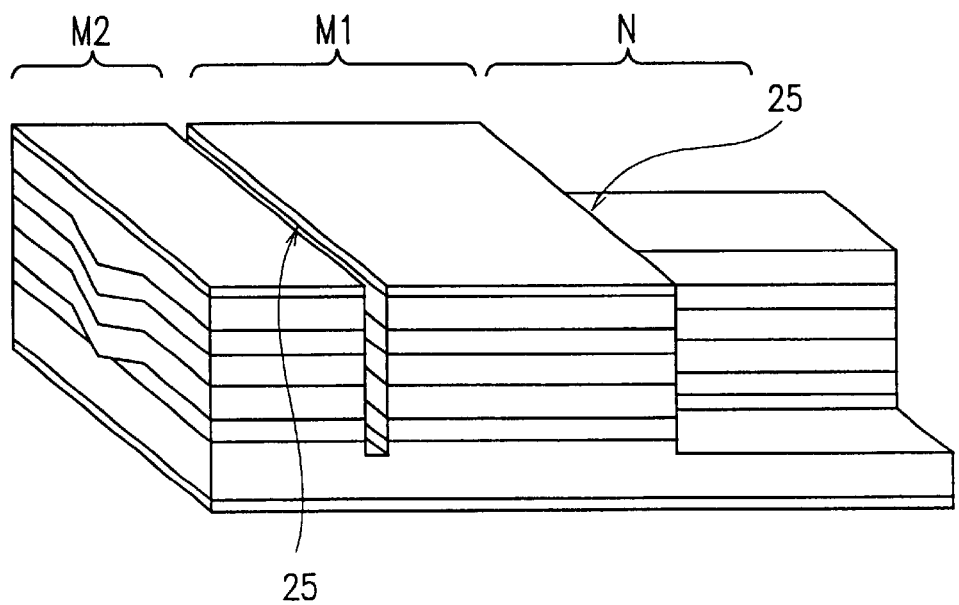
FIG. 6 is a perspective view of an alteration of the semiconductor optical integrated device of Embodiment 1 according to the present invention.

Referring to FIG. 6, two vertical separation grooves 25 are formed so as to reach the substrate, to form regions M1, M2, and N divided by the separation grooves 25. The region M1 serves as a semiconductor laser which uses the separation grooves 25 on both sides as Fabry-Perot mirrors. The region M2 serves as a photodiode which is a light receiving element, and the region N serves as an optical waveguide. Laser light emitted from one output end face of the semiconductor laser of the region M1 is absorbed by the photodiode of the region M2 to be detected as an electric signal, while laser light emitted from the other output end face of the semiconductor laser propagates through the optical waveguide of the region N.

As the second alteration, a semiconductor optical integrated device in which window areas are provided at end faces of a semiconductor laser region will be described.

Figure 7A:
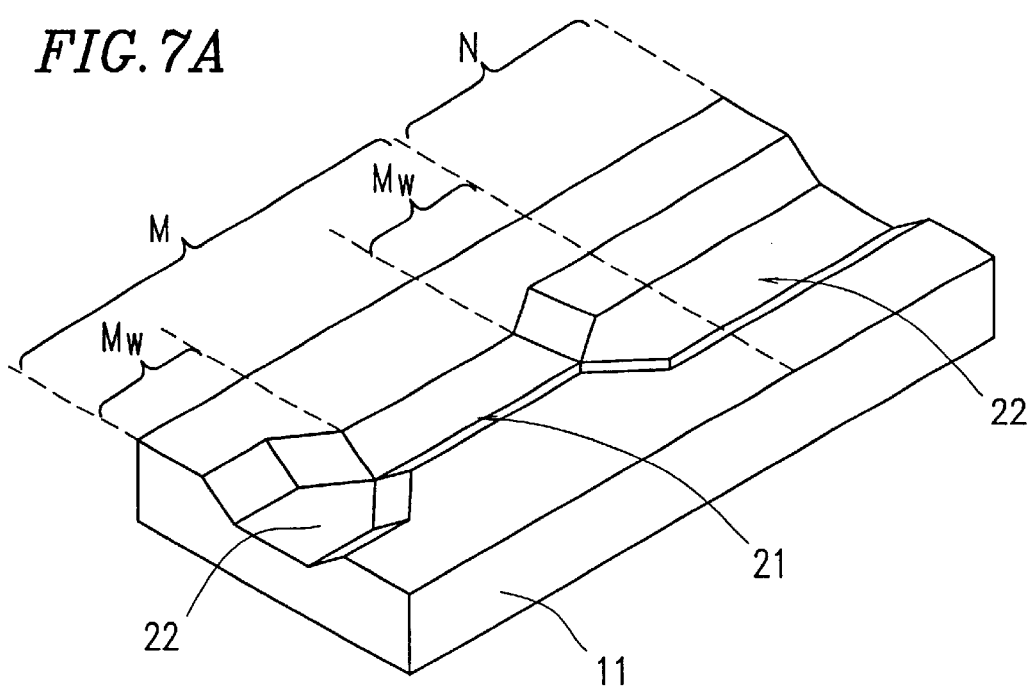
FIGS. 7A and 7B are perspective views of another alteration of the semiconductor optical integrated device of Embodiment 1 according to the present invention.
Figure 7B:
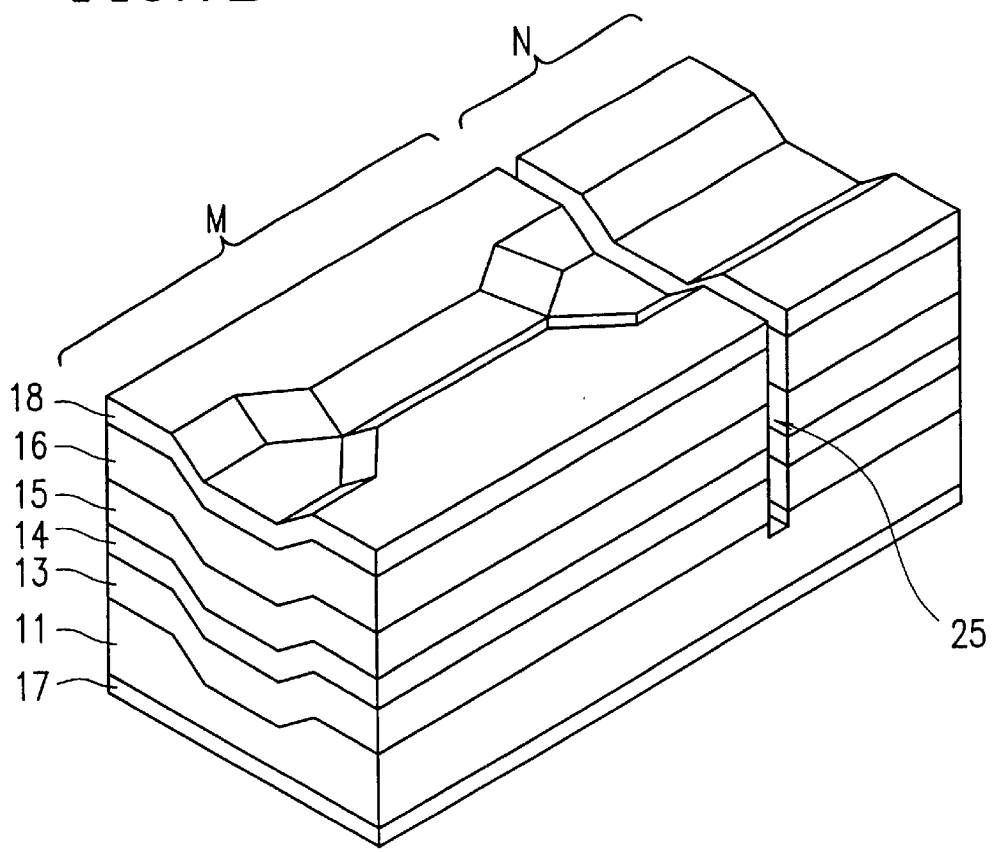

Referring to FIGS. 7A and 7B, a wide groove 22, a narrow groove 21, and another wide groove 22 are sequentially formed on a GaAs substrate 11 along the length thereof by normal photolithography and wet etching. The tilted side walls of these grooves along the length of the device are {311} A plane. A waveguide structure including a GaInNAs well layer as that described in this embodiment is formed on the resultant substrate. In FIG. 7A, a region M serves as a semiconductor laser element having window areas Mw at both end faces thereof, and a region N serves as an optical waveguide element. After the formation of the waveguide structure, a separation groove 25 is formed by dry etching and then electrodes 17 and 18 are formed on the semiconductor laser region, to complete the semiconductor optical integrated device as shown in FIG. 7B. A lateral waveguide structure such as a ridge structure and a buried heterostructure can be formed in the semiconductor laser element and the optical waveguide element.

In the semiconductor laser element of the region M, the center portion of the active layer, which is formed on {311} A plane, constitutes a quantum well having a forbidden bandwidth of 0.95 eV (corresponding to a wavelength of 1.3 $\mu$m), while each of the end face portions of the active layer, which is formed on (100) plane, constitutes a quantum well having a forbidden bandwidth of 1.08 eV (corresponding to a wavelength of 1.15 $\mu$m). Laser oscillation is normally generated by a gain of the active layer having a forbidden bandwidth corresponding to a wavelength of 1.3 $\mu$m. Accordingly, the end face portions serve as transparent "windows" for light having a wavelength of 1.3 $\mu$m. By providing such window areas, it is confirmed that light absorption at the laser end faces reduces, the laser output power is increased, and the lifetime is extended. It is also confirmed that the 1.3 $\mu$m light emitted from the semiconductor laser propagates through the optical waveguide of the region N including the core layer having a forbidden bandwidth corresponding to a wavelength of 1.15 $\mu$m, without light loss.

It can be understood that in FIG. 7B the region M can be used as an independent semiconductor laser device by forming the end faces by cleaving. Such a semiconductor laser having window areas at the end faces itself may constitute a kind of semiconductor optical integrated device, in which a semiconductor laser and window areas as transparent waveguides at the end faces of the semiconductor laser are integrated on one substrate.

(Embodiment 2)

Referring to FIGS. 8A to 8D, a method for fabricating a semiconductor optical integrated device of Embodiment 2 according to the present invention will be described. In the fabrication method, a semiconductor laser element and an optical waveguide element are integrated on one substrate. The semiconductor laser element includes an active layer of a multiple quantum well (MQW) structure having a GaInNAs well layer.

Embodiment 2 is different from Embodiment 1 most significantly in that the grooves of Embodiment 1 were formed on the substrate and the waveguide structure was formed burying the grooves, while in this embodiment a waveguide structure is formed over stripe-shaped mesas.

Hereinbelow, the fabrication method and the construction of the semiconductor optical integrated device of this embodiment will be described in detail.

Figure 8A:
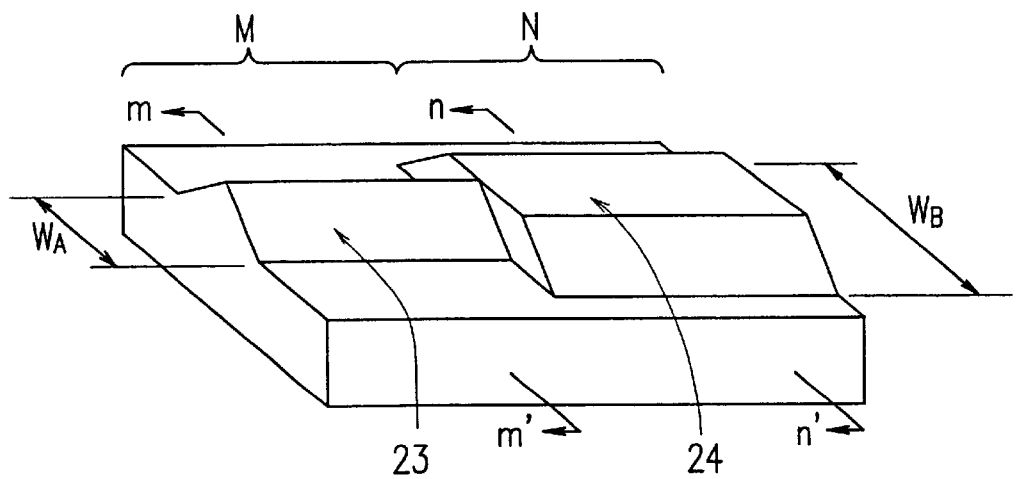

First, referring to FIG. 8A, a narrow stripe-shaped mesa 23 for a region M and a stripe-shaped mesa 24 having a wide flat top for a region N are formed on a low-resistance n-type GaAs substrate 11 having a (100) plane surface by etching. In this embodiment, referring to FIG. 8A, a width $W_A$ is about 2 μm, a width $W_B$ is about 10 μm, and the height of the mesa is about 1.5 μm. The region M serves as a semiconductor laser element and the region N serves as an optical waveguide element. The tilted side walls of the mesas 23 and 24 along the length thereof are {111} A plane.

Figure 8B:
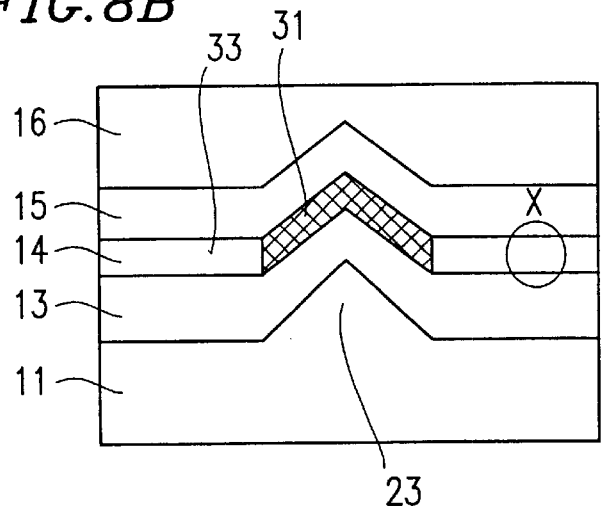
Figure 8C:
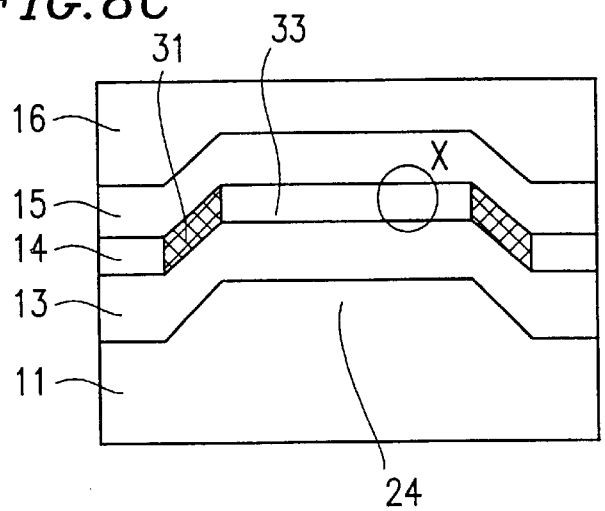
Figure 8D:
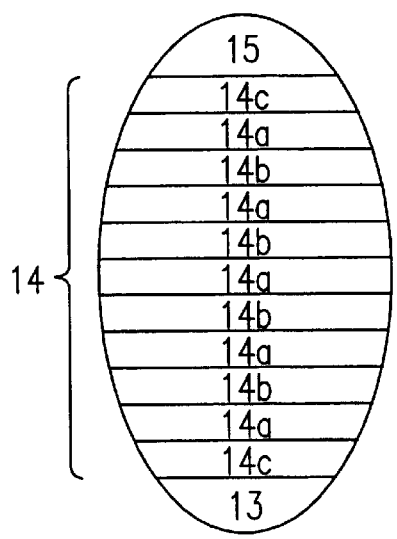

On the thus-processed substrate, layers constituting a waveguide structure are formed by crystal growth. FIG. 8B shows a section, along lines m-m' of FIG. 8A, of the waveguide structure formed over the narrow mesa 23 of the semiconductor laser element. FIG. 8C shows a section, along lines n-n' of FIG. 8A, of the waveguide structure formed over the wide mesa 24 of the optical waveguide element. The material and thickness (measured at a flat portion) of each layer of the waveguide structure are as follows.

Lower cladding layer 13: n-type $Al_{0.5}Ga_{0.5}P$ (thickness: 0.2 μm)

Active layer 14 (quintuple quantum well)

Well layer 14a: undoped $Ga_{0.905}In_{0.095}N_yAs_{1-y}$ (thickness: 8 nm)

Barrier layer 14b: undoped $Al_{0.1}Ga_{0.9}As$ (thickness: 10 nm)

Guide layer 14c: undoped $Al_{0.1}Ga_{0.9}As$ (thickness: 30 nm)

Upper cladding layer 15: p-type GaAs (thickness: 1 μm)

Contact layer 16: $p^+$-type GaAs (thickness: 0.5 μm)

The above crystal growth is performed at a growth temperature of 550° C. by MBE using respective solid materials for Ga, Al, In, and As sources and dimethylhydrazine (DMeHy) for an N source. The crystal growth of GaInNAs for the well layers 14a is performed by supplying all the materials simultaneously.

On the GaAs (100) substrate processed as shown in FIG. 8A, {111} A plane is exposed on the side walls of the mesas along the length thereof, in addition to the principal (100) plane. When materials including As and N as V group elements are grown on such a substrate, the N mole fraction of portions grown on {111} A plane, i.e., MQW portions 31 shown in FIGS. 8B and 8C, is larger than portions grown on the principal (100) plane, i.e., MQW portions 33 shown in FIGS. 8B and 8C. Specifically, in the MQW portions 31 on the A plane, the N mole fraction (y) is as large as about 0.034 and the forbidden bandwidth of the MQW is about 0.80 eV (corresponding to a wavelength of about 1.55 μm). On the contrary, in the MQW portions 33 on (100) plane, the N mole fraction (y) is as small as about 0.029, and the forbidden bandwidth is about 0.89 eV (corresponding to a wavelength of about 1.4 μm).

A distribution may be generated in a lattice constant in correspondence with the distribution of the N mole fraction. However, crystal defect will not be induced from such lattice constant distribution since the thickness of the GaInNAs layer is smaller than a critical film thickness. The GaInNAs layer on the A plane is substantially lattice-matched with the substrate, while the GaInNAs layer on (100) plane receives a compression distortion of about 0.1% against the substrate. When the MQW portion 31 on the mesa 23 in the region M is used as the active layer of the semiconductor laser element oscillating at a wavelength of 1.55 μm, and thus the MQW portion 33 on the flat top of the mesa 24 in the region N is used as the core layer of the optical waveguide element, light emitted from the semiconductor laser is allowed to propagate through the optical waveguide without being absorbed by the optical waveguide.

As in the process shown in Embodiment 1 with reference to FIG. 1C, the regions M and N are separated by a separation groove, which is used as one Fabry-Perot mirror of the semiconductor laser. A transverse mode can be confined by adopting a ridge structure, a buried heterostructure, and the like. Finally, n-side and p-side electrodes are formed by evaporation on the semiconductor laser region M, thereby to complete the semiconductor optical integrated device of this embodiment.

A current is applied to the semiconductor laser element of the thus-fabricated optical integrated device via the n-side and p-side electrodes. As a result, laser oscillation having a threshold current of 13 mA and a wavelength of 1.55 μm is obtained. Since a conventional long-time high-temperature heat treatment is not required, no degradation in the device characteristics, such as an increase in the threshold current, is observed, compared with an independent semiconductor laser device having a similar configuration.

The active layer of the semiconductor laser is formed on a plane tilted in the A plane direction while the core layer of the optical waveguide is formed on the flat plane as described above. As a result, the optical waveguide is transparent to light emitted from the semiconductor laser, allowing the light to propagate through the optical waveguide without being excessively absorbed or scattered. The propagating light is efficiently retrieved at the other end face of the optical waveguide located away from the semiconductor laser. Since the light emitting layer of the light emitting element and the optical guide layer of the optical waveguide element are simultaneously grown as one continuous layer, no displacement or seam between the layers is observed, and excessive light loss or scattering is scarcely observed.

It can be understood that in this embodiment, alterations corresponding to the first and second alterations shown in Embodiment 1 are possible.

(Embodiment 3)

Referring to FIGS. 9A to 9D, a method for fabricating a semiconductor optical integrated device of Embodiment 3 according to the present invention will be described. In the fabrication method, a semiconductor laser element and an optical waveguide element are integrated on one substrate. The semiconductor laser element includes an active layer of a multiple quantum well (MQW) structure having a GaNAs well layer.

Embodiment 3 is different from Embodiments 1 and 2 most significantly in that, in this embodiment, the tilted side walls of a processed substrate are a B plane.

Hereinbelow, the fabrication method and the construction of the semiconductor optical integrated device of this embodiment will be described in detail.

Figure 9A:
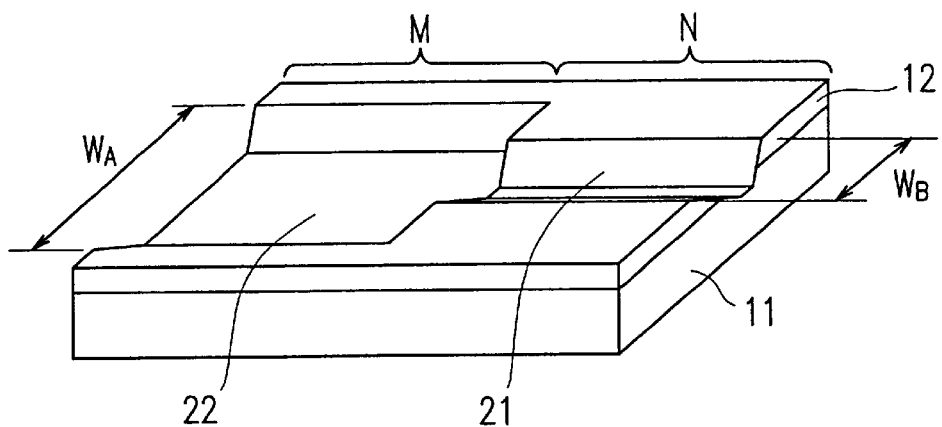

First, referring to FIG. 9A, a groove 22 having a wide flat bottom for a region M and a groove 21 having a narrow flat bottom for a region N are formed on a low-resistance n-type GaAs substrate 11 having a (100) plane surface by etching. In this embodiment, referring to FIG. 9A, a width $W_A$ is about 20 μm, a width $W_B$ is about 3 μm, and the depth of the grooves is about 0.7 μm. The region M serves as a semiconductor laser element and the region N serves as an optical waveguide element. The tilted side walls of the grooves 21 and 22 along the length thereof are {111} B plane.

Figure 9B:
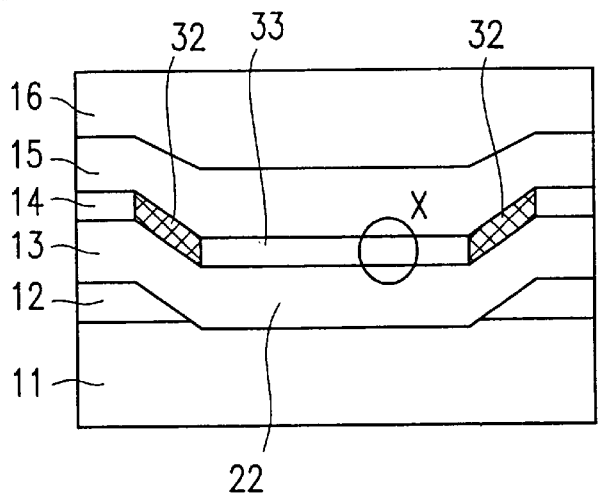
Figure 9D:
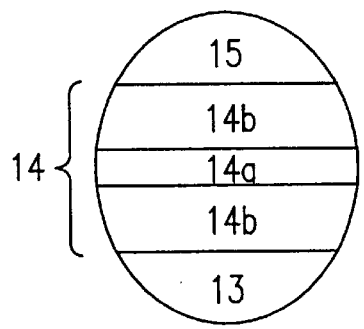
Figure 9C:
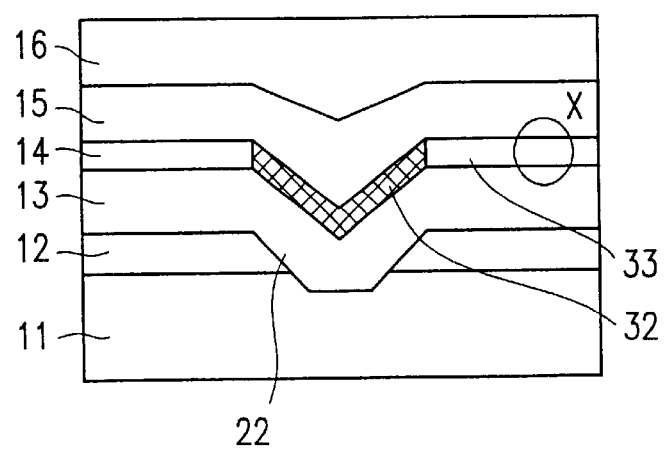

On the thus-processed substrate, layers constituting a waveguide structure are formed by crystal growth. FIG. 9B shows a section of the multilayer structure formed over the wide groove 22 of the semiconductor laser element. FIG. 9C shows a section of the multilayer structure formed over the narrow groove portion 21 of the optical waveguide element. The material and thickness (measured at a flat portion) of each layer of the multilayer structure are as follows.

Lower cladding layer 13: n-type $Al_{0.3}Ga_{0.7}As$ (thickness: 0.2 μm)

Active layer 14 (single quantum well)

Well layer 14a: undoped $GaN_yAs_{1-y}$ (thickness: 8 nm)

Barrier layer 14b: undoped $Ga_{0.95}In_{0.05}As$ (thickness: 15 nm)

Upper cladding layer 15: p-type $Al_{0.3}Ga_{0.7}As$ (thickness: 1 μm)

Contact layer 16: $p^+$-type GaAs (thickness: 0.5 μm)

The above crystal growth is performed at a growth temperature of 600° C. by metal organic chemical vapor deposition (MO-CVD) using trimethylgallium (TMGa), trimethylaluminium (TMAl), trimethylindium (TMIn), arsine ($AsH_3$) as Ga, Al, In, and As sources, respectively, and monomethylhydrazine (MMeHy) as an N source. The crystal growth of GaInNAs is performed by supplying the V group materials alternately.

The outermost surface of the GaAs (100) substrate processed as shown in FIG. 9A includes {111} B plane exposed on the tilted side walls of the grooves extending along the length thereof, in addition to the principal (100) plane. When the V group materials including As and N are grown on such a substrate, the amount of As atoms replaced by N atoms is smaller in portions 32 grown on {111} B plane shown in FIGS. 9B and 9C than in portions 33 grown on the principal (100) plane since As atoms are strongly bonded with Ga atoms via triple bonds, and thus the N mole fraction of the portions 32 is slightly smaller than that of the portions 33. Specifically, in the portions 32 on the B plane, the N mole fraction (y) is as small as about 0.02 and the forbidden bandwidth of the MQW structure is about 1.13 eV (corresponding to a wavelength of about 1.55 μm). On the contrary, in the portions 33 on (100) plane, the N mole fraction (y) is as large as about 0.03, and the forbidden bandwidth is about 0.95 eV (corresponding to a wavelength of about 1.31 μm).

A distribution is generated in a lattice constant in correspondence with the distribution of the N mole fraction. However, crystal defect will not be induced from the lattice constant distribution since the thickness of the GaNAs layer is smaller than a critical film thickness. The GaNAs layer on the B plane receives a tension distortion of about 0.4% against the substrate, while the GaNAs layer on (100) plane receives a tension distortion of about 0.6% against the substrate.

The GaInAs barrier layers receive compression distortion of about 0.35%, and thus, together with the GaNAs well layer, constitute a distortion compensation quantum well.

When the MQW portion 33 formed above the flat bottom of the groove in the region M is used as the active layer of the semiconductor laser which oscillates at a wavelength of 1.3 μm, and the MQE portion 32 formed above the tilted side walls of the groove in the region N is used as the core layer of the optical waveguide, light emitted from the semiconductor laser is allowed to propagate through the optical waveguide without being absorbed.

As in the process shown in Embodiment 1 with reference to FIG. 1C, the regions M and N are separated by a separation groove, which is used as one Fabry-Perot mirror of the semiconductor laser. A transverse mode can be confined by adopting a ridge structure, a buried heterostructure, or the like. Finally, n-side and p-side electrodes are formed by evaporation on the semiconductor laser region M, thereby to complete the semiconductor optical integrated device of this embodiment.

A current is applied to the semiconductor laser element of the thus-fabricated optical integrated device via the n-side and p-side electrodes. As a result, laser oscillation is obtained at a threshold current of 10 mA and a wavelength of 1.3 μm. Since a conventional long-time high-temperature heat treatment is not required, no degradation in the device characteristics, such as an increase in the threshold current, is observed, compared with an independent semiconductor laser device having a similar configuration.

The active layer of the semiconductor laser is formed on (100) plane while the core layer of the optical waveguide is formed on the B plane as described above. As a result, the optical waveguide is transparent to light emitted from the semiconductor laser, allowing the emitted laser light to propagate through the optical waveguide without being excessively absorbed or scattered. The propagating light is efficiently retrieved at the other end face of the optical waveguide located away from the semiconductor laser. Since the light emitting layer of the light emitting element and the optical guide layer of the optical waveguide element are simultaneously grown as one continuous layer, no displacement or seam between the layers is observed, and excessive light loss or scattering is scarcely observed.

It can be understood that in this embodiment, alterations corresponding to the first and second alterations shown in Embodiment 1 are possible. In order to realize an alternation corresponding to the second alteration, the semiconductor laser should be formed so that the end face portions are on a B plane and the center portion is on (100) plane.

(Embodiment 4)

Referring to FIGS. 10A to 10D, 11A, and 11B, a method for fabricating a semiconductor optical integrated device of Embodiment 4 according to the present invention will be described. In the fabrication method, a semiconductor laser element and a modulator are integrated on one substrate. The semiconductor laser element is a gain-coupled distributed feedback laser diode (GC-DFB-LD) using GaInNAs for a well layer of a multiple quantum well (MQW) active layer and for an absorptive diffraction grating. Such a DFB-LD itself may constitute a kind of semiconductor optical integrated device in which a semiconductor laser and a diffraction grating are integrated on one substrate.

Hereinbelow, the fabrication method and the construction of the semiconductor optical integrated device of this embodiment will be described in detail.

Figure 10A:
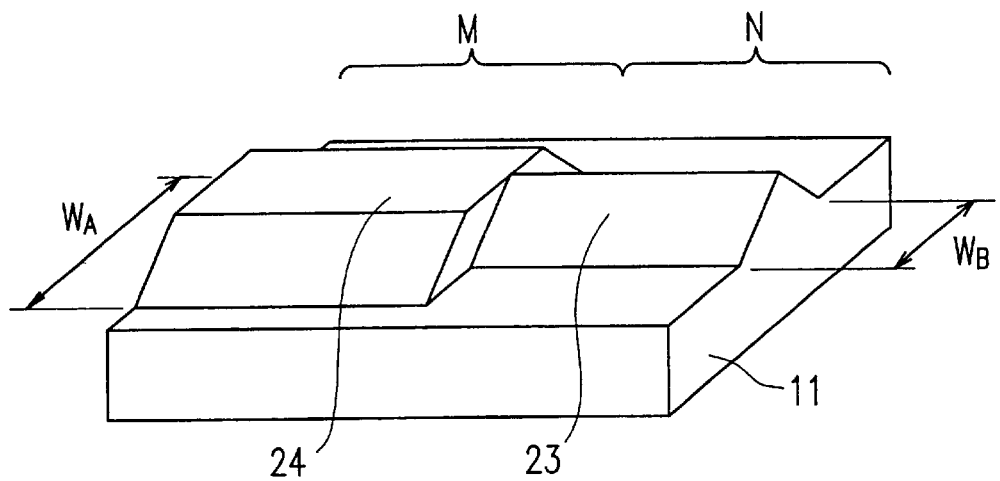

First, referring to FIG. 10A, a stripe-shaped mesa 24 having a wide flat top for a region M and a narrow stripe-shaped mesa 24 for a region N are formed on a low-resistance n-type GaAs substrate 11 having a (100) plane surface by patterning using a normal photolithographic technique and wet etching. In this embodiment, referring to FIG. 10A, a width $W_A$ is about 20 μm, a width $W_B$ is about 6 μm, and the height of the mesas is about 1.4 μm. The region M serves as a semiconductor laser element and the region N serves as a modulator. The tilted side walls of the mesas 23 and 24 along the length thereof are {311} B plane.

Figure 10B:
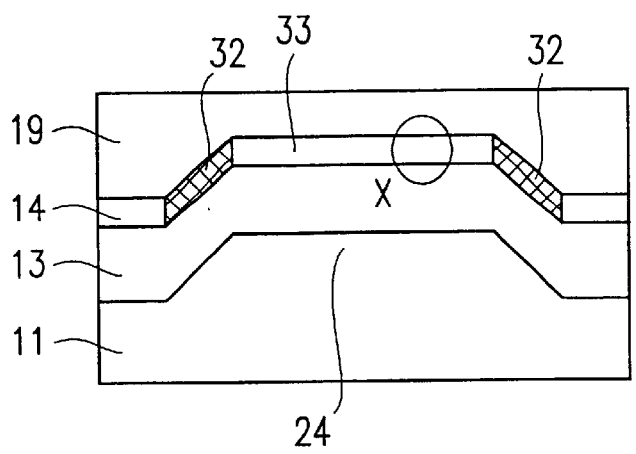
Figure 10C:
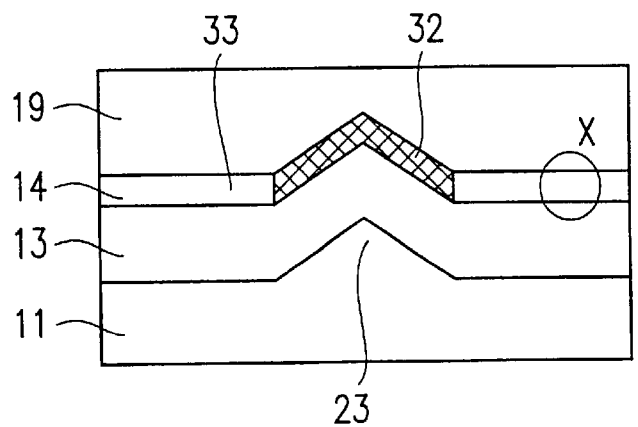
Figure 10D:
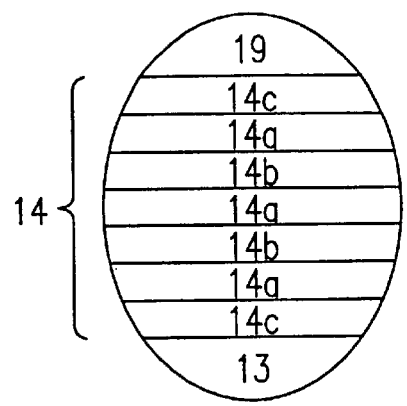

On the thus-processed substrate, layers constituting a waveguide structure are formed by crystal growth. FIG. 10B shows a section of the waveguide structure formed over the stripe-shaped mesa 24 having a wide flat top in the region M for the semiconductor laser element. FIG. 10C shows a section of the waveguide structure formed over the narrow stripe-shaped mesa 23 in the region N for the modulator. The material and thickness (measured at a flat portion) of each layer of the waveguide structure are as follows.

Lower cladding layer 13: n-type $In_{0.5}Ga_{0.5}P$ (thickness: 0.2 μm)

Active layer 14 (triple quantum well)
   Well layer 14a: undoped $Ga_{0.8}In_{0.2}N_yAs_{1-y}$ (thickness: 8 nm)
   Barrier layer 14b: undoped $Al_{0.1}Ga_{0.9}As$ (thickness: 10 nm)
   Guide layer 14c: undoped $Al_{0.1}Ga_{0.9}As$ (thickness: 30 nm)

Optical waveguide layer 19: p-type $In_{0.5}Ga_{0.5}P$ (thickness: 0.2 μm)

The above crystal growth is performed at a growth temperature of 500° C. by chemical beam epitaxy (CBE) using trimethylgallium (TMGa), trimethylaluminium (TMAl), trimethylindium (TMIn), arsine ($AsH_3$) as Ga, Al, In, and As sources, respectively, and ammonia gas ($NH_3$) cracked at 500° C. as an N source. The crystal growth of the GaInNAs well layer of the active layer is performed by supplying the V group materials alternately.

The outermost surface of the GaAs (100) substrate processed as shown in FIG. 10A includes {311} B plane exposed on the tilted side walls of the mesas extending along the length thereof, in addition to the principal (100) plane. When the materials including As and N as the V group elements are grown on such a substrate, the amount of As atoms replaced by N atoms is larger in portions 32 grown on {311} B plane than in portions 33 grown on the principal (100) plane, and thus the N mole fraction of the portions 32 is slightly smaller than that of the portions 33. Specifically, in the MQW portions 32 on the B plane, the N mole fraction (y) is as small as about 0.009 and the forbidden bandwidth of the MQW is about 1.08 eV (corresponding to a wavelength of about 1.15 μm). On the contrary, in the MQW portions 33 on (100) plane, the N mole fraction (y) is as large as about 0.018, and the forbidden bandwidth is about 0.95 eV (corresponding to a wavelength of about 1.31 μm).

A distribution is generated in a lattice constant in correspondence with the distribution of the N mole fraction. However, crystal defect will not be induced from such lattice constant distribution since the thickness of the GaInNAs layer is smaller than a critical film thickness. The GaInNAs layer on (100) plane receives a compression distortion of about 1.0% against the substrate, while the GaInNAs layer on the B plane receives a compression distortion of about 1.3% against the substrate.

Figure 11A:
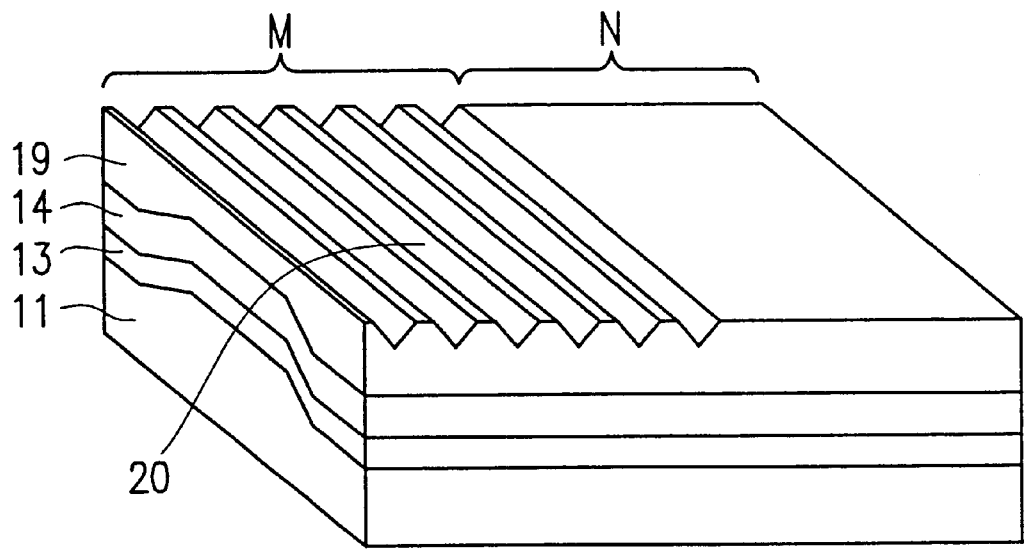
FIGS. 11A and 11B are perspective views illustrating a fabrication process of the semiconductor optical integrated device of Embodiment 4.

Thereafter, referring to FIG. 11A, a diffraction grating 20, which is composed of V-shaped grooves having a depth of 0.1 μm at a pitch of 0.2 μm with flat top portions therebetween, is formed on the surface of the resultant structure by two-beam interference exposure and wet etching, so that the V-shaped grooves are orthogonal to the length of the stripe-shaped mesa formed on the substrate.

Figure 11B:
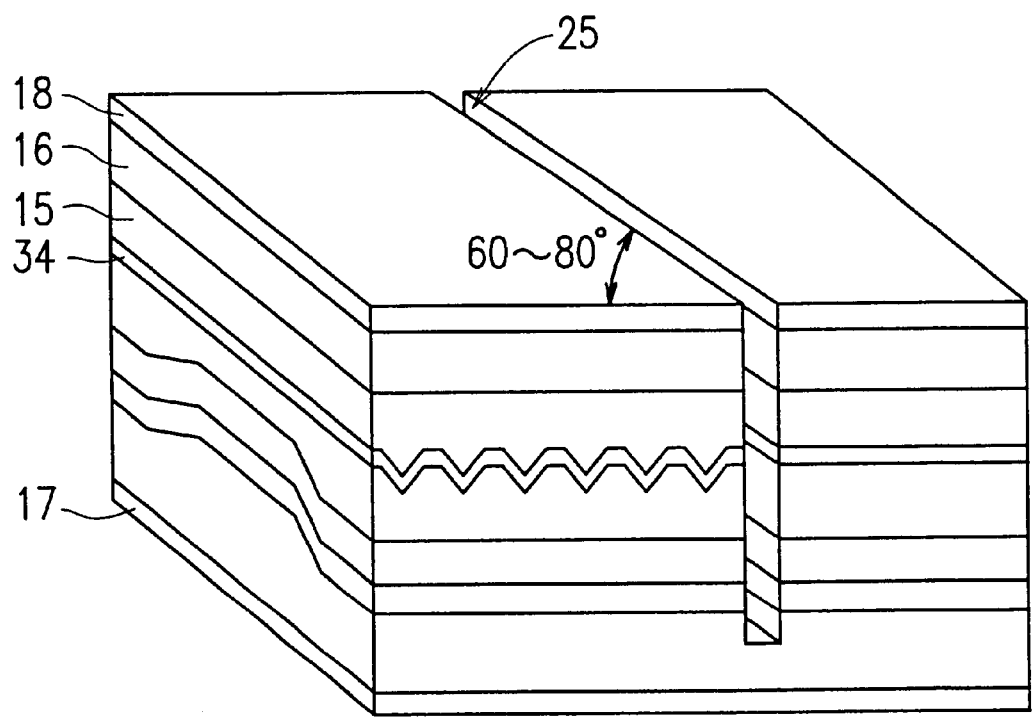
Figure 12A:
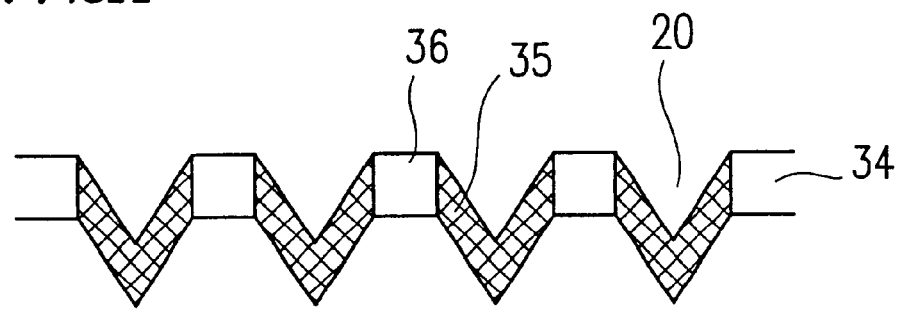
FIGS. 12A to 12C are views illustrating examples of a diffraction grating of the semiconductor optical integrated device of Embodiment 4.

Referring to FIG. 11B, a GaInNAs layer 34 is grown on the resultant structure to a thickness of about 0.03 μm by supplying the V group materials alternately in a manner as described in Embodiment 1. FIG. 12A shows a section, along the length of the semiconductor laser, of a main portion of the GaInNAs layer 34 of the diffraction grating region.

Referring to FIG. 12A, {111} A plane is exposed on the tilted side walls of the grooves of the diffraction grating formed by etching, while (100) plane is exposed on the flat top portions. As a result, GaInNAs portions 35 having a larger N mole fraction and a smaller forbidden bandwidth are formed on the tilted side walls, while GaInNAs portions 36 having a smaller N mole fraction and a larger forbidden bandwidth are formed on the flat top portions. Thus, the distribution of the mole fraction of the GaInNAs layer can be controlled so that the GaInNAs portions 35 having a smaller forbidden bandwidth formed on the tilted side walls absorb light having a wavelength of 1.3 μm emitted from the active layer, and that the GaInNAs portions 36 having a larger forbidden bandwidth formed on the flat top portions are transparent to the light having a wavelength of 1.3 μm during the crystal growth. In this way, a diffraction grating having periodic absorption in the direction of the resonator of the semiconductor laser is obtained.

Thereafter, p-type $In_{0.5}Ga_{0.5}P$ is grown on the resultant GaInNAs layer to a thickness of about 0.8 μm to form an upper cladding layer 15, and then p-type GaAs is grown to a thickness of about 0.5 μm to form a contact layer 16. Finally, a separation groove 25 having a width of 2 μm for separating the regions M and N is formed. The separation groove 25 is tilted by about 60 to 80° with respect to the laser resonator direction so as to prevent oscillated light emitted from the semiconductor laser from being reflected by the separation groove 25 and returning to the semiconductor laser. N-side and p-side electrodes 17 and 18 are formed by evaporation for each of the regions M and N, so as to complete the semiconductor optical integrated device of this embodiment.

A current is applied to the semiconductor laser element of the thus-fabricated optical integrated device via the n-side and p-side electrodes 17 and 18. As a result, laser oscillation is obtained at a threshold current of 10 mA and a wavelength of 1.3 μm. Since the semiconductor laser element is provided with the periodic absorptive diffraction grating, the emitted laser light exhibits stable single-wavelength oscillation. Since a conventional long-time high-temperature heat treatment is not required, no degradation in the device characteristics, such as an increase in the threshold current, is observed, compared with an independent semiconductor laser device having a similar configuration.

In addition, by applying an electric field to the electrodes in the region N, DFB laser light which is propagating in the region N is successfully modulated. Since the light emitting layer of the light emitting element and the optical guide layer of the modulator are simultaneously grown as one continuous layer, no displacement or seam between the layers is observed, and excessive light loss or scattering is scarcely observed.

In this embodiment, the diffraction grating is formed in such a direction that allows the A plane to be exposed on the tilted side walls of the grooves of the diffraction grating. It would be understood that, if the diffraction grating is formed in such a direction that allows a B plane to be exposed, the GaInNAs portions on the flat top portions absorb light while the GaInNAs portions on the tilted side walls are transparent to light.

Figure 12B:
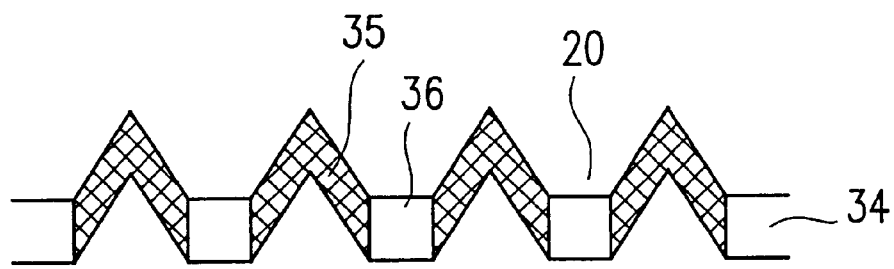
Figure 12C:
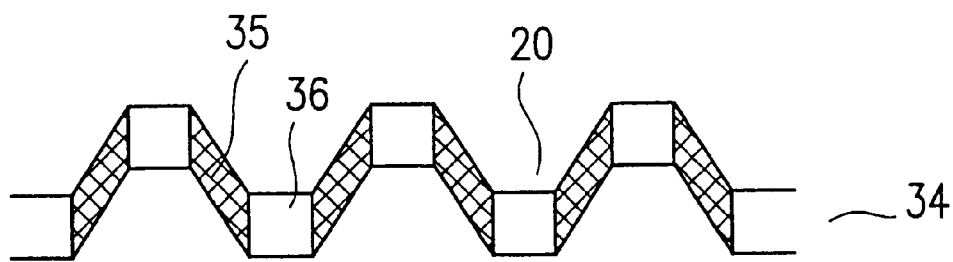

The diffraction grating may have shapes other than that described above. For example, the bottoms of the grooves may be flat as shown in FIG. 12B, or both the top portions and the groove bottoms may be flat (100) plane as shown in FIG. 12C. In the latter case, the absorption is modulated at a pitch of half the original pitch of the diffraction grating.

As an alternative example, a diffraction grating may be formed on the substrate or the lower cladding layer and the active layer including the GaInNAs layer may be grown over the diffraction grating portion. In this case, since the forbidden bandwidth and gain of the active layer are periodically changed depending on the period of the diffraction grating, a gain diffraction grating type GC-DFB-LD is obtained. If concave and convex portions of the diffraction grating are arranged at a pitch on the order of several hundred angstroms, the GaInNAs layer formed on such concave and convex portions constitutes quantum wires.

It can be understood that in this embodiment, alterations corresponding to the first and second alterations shown in Embodiment 1 are possible. It can also be easily understood that the region M only can be used as an independent semiconductor laser device.

(Embodiment 5)

Referring to FIGS. 13A to 13D, a method for fabricating a gain-coupled distributed feedback (GC-DFB) semiconductor laser device including a gain diffraction grating made of GaInNAs of Embodiment 5 according to the present invention will be described.

In this embodiment, metal organic chemical vapor deposition (MO-CVD) is employed for crystal growth using trimethylgallium (TMGa), trimethylaluminium (TMAl), trimethylindium (TMIn), arsine ($AsH_3$) as Ga, Al, In, and As sources, respectively, and dimethylhydrazine (DMeHy) as an N source at a growth temperature of 550° C.

Hereinbelow, the fabrication method and the construction of the semiconductor laser device of this embodiment will be described in detail.

Figure 13A:
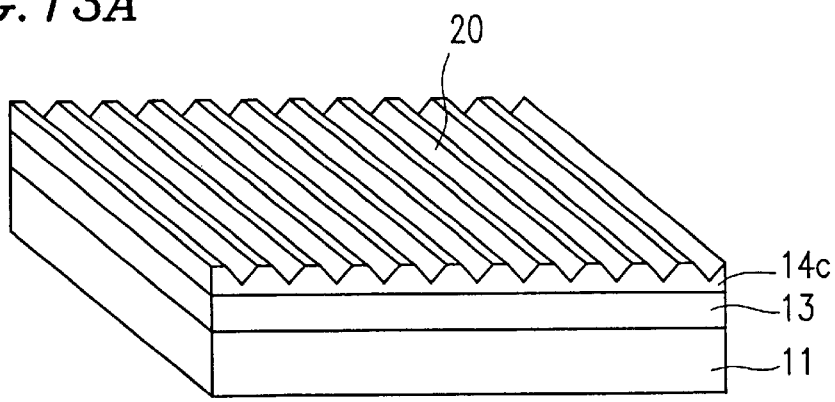
FIGS. 13A to 13C are perspective views illustrating a fabrication process of a semiconductor optical integrated device of Embodiment 5 according to the present invention.

First, referring to FIG. 13A, the first crystal growth is performed on a low-resistance n-type GaAs (100) substrate 11 to form a lower cladding layer 13 made of n-type $Al_{0.3}Ga_{0.7}As$ having a thickness of about 1.0 μm and a lower guide layer 14c made of undoped GaAs having a thickness of about 0.2 μm.

Thereafter, a diffraction grating 20, which is composed of V-shaped grooves having a depth of 0.1 μm at a pitch of 0.233 μm with flat top portions therebetween, is formed on the surface of the guide layer 14c by two-beam interference exposure and wet etching. The direction of the diffraction grating is determined so that {111} A plane is exposed on the tilted side walls of the V-shaped grooves. The pitch of the diffraction grating is determined so that Bragg wavelength is 1.55 μm.

Figure 13B:
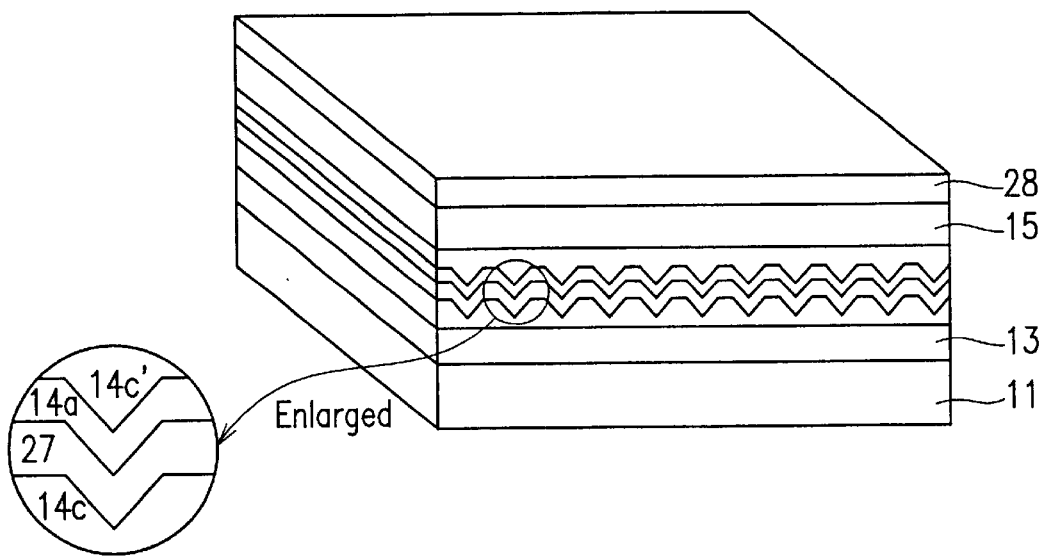

Referring to FIG. 13B, the following layers are sequentially formed on the diffraction grating 20.
Buffer layer 27: undoped GaAs (thickness: 0.02 μm)
Well layer 14a: undoped $Ga_{0.9}In_{0.1}N_yAs_{1-y}$ (thickness: 8 nm)
Upper guide layer 14c': undoped GaAs (thickness: 0.15 μm)
Upper cladding layer 15: p-type $Al_{0.3}Ga_{0.7}As$ (thickness: 1.0 nm)
Cap layer 28: p-type GaAs (thickness: 0.2 nm)

The thickness of the upper guide layer 14c' is measured at the flat portion thereof. It is found that the buffer layer 27 and the well layer 14a are grown substantially keeping the concave and convex shape of the diffraction grating 20. The concave and convex shape is substantially flattened by the upper guide layer 14c' having a larger thickness than the underlying two layers at the interface with the upper cladding layer 15.

Figure 13C:
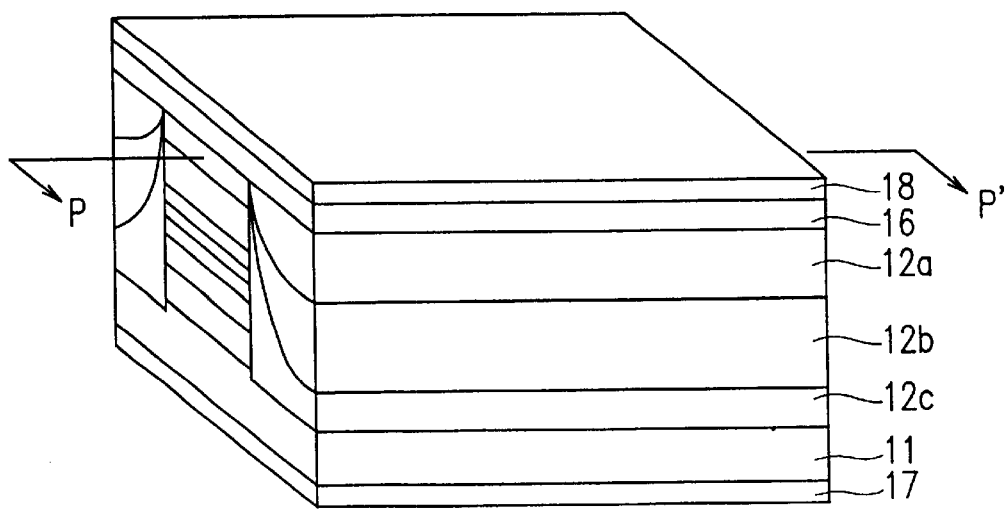

Referring to FIG. 13C, the resultant multilayer structure is partly etched to reach the substrate 11 so as to form a mesa having a width of about 2 μm extending in a direction orthogonal to the grooves of the diffraction grating 20. The etched-away portions are buried with p-type $Al_{0.3}Ga_{0.7}As$, n-type $Al_{0.3}Ga_{0.7}As$, and again p-type $Al_{0.3}Ga_{0.7}As$, to form current-narrowing layers 12a, 12b, and 12c. A $p^+$-type contact layer 16 is grown on the resultant structure to a thickness of about 0.5 μm. N-side and p-side electrodes 17 and 18 are then formed by evaporation, and the resultant structure is cleaved to form a semiconductor laser device having a resonator length of about 300 μm.

A current is applied to the thus-fabricated semiconductor laser device via the n-side and p-side electrodes 17 and 18. As a result, laser oscillation is obtained at a threshold current of 10 mA and a wavelength of 1.55 μm. The laser light obtained via the periodic gain diffraction grating generates stable single-wavelength oscillation, exhibiting good single vertical mode characteristics as the GC-DFB semiconductor laser device. Since a conventional long-time high-temperature heat treatment is not required, no degradation in the device characteristics, such as an increase in the threshold current, is observed, compared with a semiconductor laser device having a similar configuration fabricated by a conventional method.

Hereinbelow, the characteristics and operation principle of the semiconductor laser device of this embodiment will be described.

Figure 14:
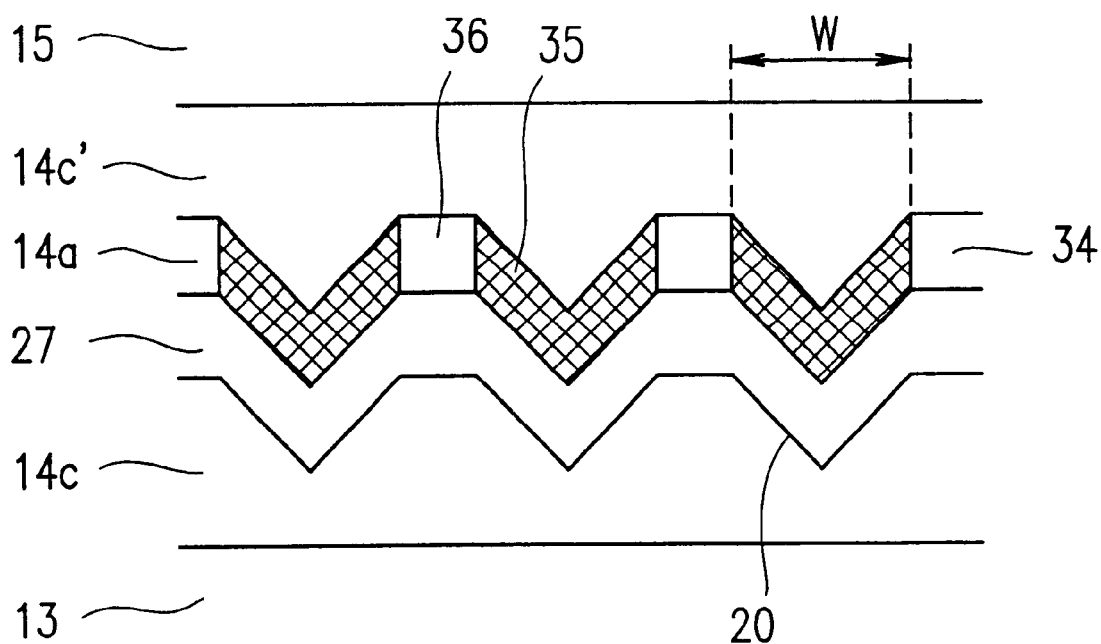
FIG. 14 is a view illustrating a main portion of the semiconductor optical integrated device of Embodiment 5.
Figure 15A:
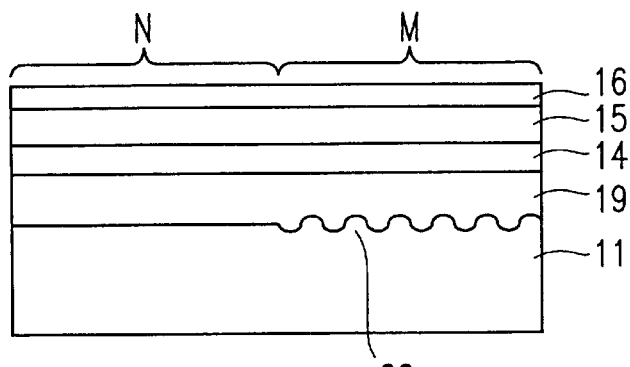
FIGS. 15A and 15B are cross-sectional views taken along line a-a' of FIG. 15C, illustrating a conventional method for fabricating a semiconductor optical integrated device.
Figure 15B:
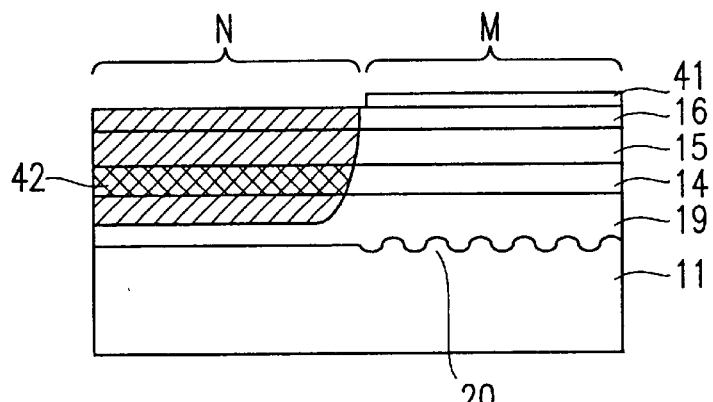
Figure 15C:
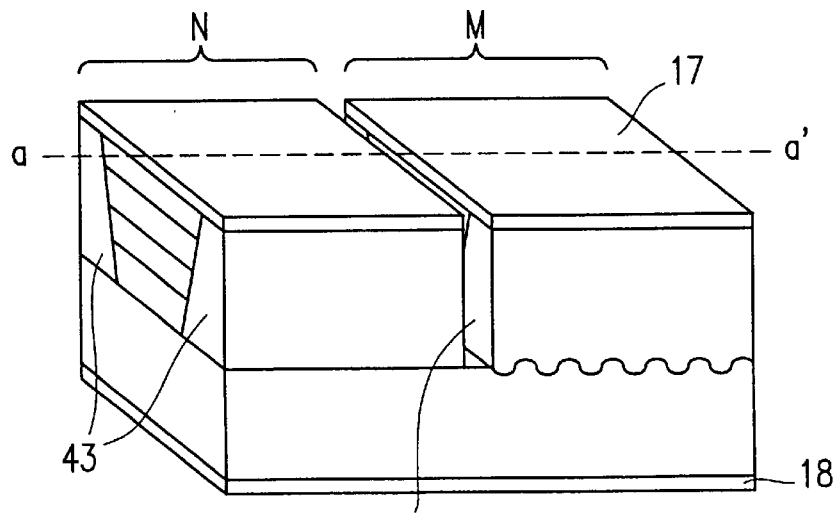
FIG. 15C is a perspective view illustrating the conventional semiconductor optical integrated device.

FIG. 14 is a cross-sectional view of a main portion of the semiconductor laser device of this embodiment along the length thereof. {111} A plane is exposed on the tilted side walls of the grooves of the diffraction grating formed by etching, while (100) plane is exposed on the flat top portions of the diffraction grating. A GaInNAs portion 35 grown on each tilted groove portion includes a larger amount of nitrogen, constituting a quantum well portion having an N mole fraction (y) of about 0.035 and a forbidden bandwidth corresponding to a wavelength of about 1.55 μm. A GaInNAs portion 36 grown on each flat top portion includes a smaller amount of nitrogen, constituting a quantum well portion having an N mole fraction (y) of about 0.024 and a forbidden bandwidth corresponding to a wavelength of about 1.30 μm. In other words, 1.55 μm gain portions and 1.30 μm gain portions alternately exist. A distribution is generated in a lattice constant in correspondence with the distribution of the N mole fraction in the GaInNAs layer. While the 1.55 μm gain portions lattice-match with the substrate, the 1.30 μm gain portions include a tension distortion of about +0.2%. Although the lattice constant distribution is generated, crystal defect will not be induced even if a large forbidden bandwidth distribution is generated in the GaInNAs quantum well since in the GaInNAs quantum well a large forbidden bandwidth distribution is generated only by a small N mole fraction distribution.

Carriers introduced into the active layer, which includes the 1.55 μm gain portions and the 1.30 μm gain portions, concentrate in the 1.55 μm gain portions having a smaller forbidden bandwidth. Since the refractive index of the 1.55 μm gain portions is higher than that of the 1.30 μm gain portions, it is preferable to match the 1.55 μm gain portions with the peak wavelength of a standing wave in the resonator. Thus, the pitch of the diffraction grating is determined so that the Bragg wavelength is 1.55 μm. The 1.55 μm induced emitted light subjected to distributed feedback by the diffraction grating is amplified in the 1.55 μm gain portions which periodically exist in the active layer, to generate laser oscillation.

If the width of each 1.55 μm gain portion (denoted by w in FIG. 14) formed on the diffraction grating is reduced to several hundred angstrom or less, the GaInNAs active layer can serve as quantum wires.

In this embodiment, the diffraction grating is formed in such a direction that allows the A plane to be exposed on the tilted side walls of grooves of the diffraction grating. It should be understood that, if the diffraction grating is formed in such a direction that allows a {n11} B plane to be exposed, a GC-DFB semiconductor laser device similar to that described above can be obtained although, in this case, the forbidden bandwidth of the GaInNAs layer on the flat top portions is smaller than that of the GaInNAs layer on the tilted groove portions.

As in Embodiment 4, the diffraction grating may have shapes other than that described above. For example, the bottom of each groove maybe flat as shown in FIG. 12B, or both the top portions and the groove bottoms may be flat (100) plane as shown in FIG. 12C. In the latter case, the absorption is modulated at a pitch of half the original pitch of the diffraction grating. Other variations in shape, pitch, and the like of the diffraction grating are also possible.

In this embodiment, the independent semiconductor laser device was described. It can be understood that such a laser device can be integrated with an optical waveguide and a light receiving element on one substrate in a manner as described in Embodiments 1 to 4.

(Embodiment 6)

A method for fabricating a semiconductor optical integrated device of Embodiment 6 according to the present invention will be described. In this embodiment, a semiconductor laser element which includes an active layer of a multiple quantum well (MQW) structure having a GaInPN well layer and an optical waveguide element are integrated on one substrate. This embodiment is different from the method in Embodiments 1 to 5 in that the well layer in the MQW active layer or the core layer of Embodiments 1 to 5 is made of a compound semiconductor containing As and N as V group elements, while in this embodiment the well layer is made of a compound semiconductor containing phosphorus (P) and N as V group elements.

The construction of the device fabricated in this embodiment is the same as that described in Embodiment 1 with reference to FIGS. 1A to 1C and 2A to 2C, except that the materials and thicknesses of the layers are changed to the following.

Lower cladding layer 13: n-type $(Al_{0.7}Ga_{0.3})_{0.52}In_{0.48}P$ (thickness: 1 $\mu$m)

Active layer 14 (triple quantum well)

Well layer 14a: undoped $Ga_{0.48}In_{0.52}P_{1-y}N_y$ (thickness: 8 nm)

Barrier layer 14b: undoped $(Al_{0.4}Ga_{0.6})_{0.52}In_{0.48}P$ (thickness: 10 nm)

Guide layer 14c: undoped $(Al_{0.4}Ga_{0.6})_{0.52}In_{0.48}P$ (thickness: 30 nm)

Upper cladding layer 15: p-type $(Al_{0.7}Ga_{0.3})_{0.52}In_{0.48}P$ (thickness: 1 $\mu$m)

Contact layer 16: $p^+$-type GaAs (thickness: 0.5 $\mu$m)

The same substrate and crystal growth method as those described in Embodiment 1 are employed.

Hereinbelow, the fabrication method and construction in this embodiment will be described in detail.

The outermost surface of the GaAs (100) substrate processed as shown in FIG. 1A includes {311} A plane exposed on the side walls of the grooves along the length of the grooves, in addition to the principal (100) plane. When materials including P and N as V group elements are grown on such a substrate, the N mole fraction in portions grown on {311} A plane is slightly larger than that in portions grown on the principal (100) plane. Specifically, referring to FIGS. 2A and 2B, the N mole fraction (y) of GaInPN crystal as the well layer of the MQW portions 31 formed on the A plane is as large as about 0.02, and the forbidden bandwidth of the MQW is about 1.53 eV (corresponding to a wavelength of 810 nm). On the contrary, the N mole fraction (y) of GaInPN crystal as the well layer of the MQW portions 33 formed on the principal (100) plane is as small as about 0.013, and the forbidden bandwidth of the MQW is about 1.64 eV (corresponding to a wavelength of 755 nm).

A distribution is generated in a lattice constant in correspondence with the distribution of the N mole fraction. However, crystal defect will not be induced from the lattice constant distribution since the thickness of the GaInPN well layer is smaller than a critical film thickness. When the MQW portion 31 shown in FIG. 2A is used for the active layer of the semiconductor laser, and thus the MQW portion 33 shown in FIG. 2B is used as the core layer of the optical waveguide, light emitted from the semiconductor laser is allowed to propagate through the optical waveguide without being absorbed.

A current is applied to the semiconductor laser element of the thus-fabricated optical integrated device via the n-side electrode 17 and the p-side electrode 18. The current is narrowed by the current-narrowing layer 12 and flows into the V-shaped portion of the active layer, to realize laser oscillation having a threshold current of 10 mA and a wavelength band of 810 nm. Since a conventional long-time high-temperature heat treatment is not required, no degradation in the device characteristics, such as an increase in the threshold current, is observed, compared with an independent semiconductor laser device having a similar configuration.

The core layer of the optical waveguide is formed on (100) plane while the active layer of the semiconductor laser is formed on a plane tilted in the A plane direction as described above. As a result, the optical waveguide is transparent to light emitted from the semiconductor laser, allowing the light to propagate therethrough without being excessively absorbed or scattered. The propagating light is efficiently retrieved at the other end face of the optical waveguide located away from the semiconductor laser. Since the light emitting layer of the light emitting element and the optical guide layer of the optical waveguide element are formed by simultaneous crystal growth as one continuous layer, no displacement or seam between the layers is observed, and excessive light loss or scattering is scarcely observed.

It can be understood that in this embodiment, alterations corresponding to the first and second alterations shown in Embodiment 1 are possible.

(Embodiment 7)

A method for fabricating a semiconductor optical integrated device of Embodiment 7 according to the present invention will be described. In this embodiment, a semiconductor laser element which includes an active layer of a multiple quantum well (MQW) structure having a GaAsSbN well layer and an optical waveguide element are integrated on one substrate. This embodiment is different from Embodiments 1 to 6 in that the well layer of the MQW active layer or the core layer of Embodiments 1 to 6 is made of a compound semiconductor containing As or P as a V group element in addition to N, while in this embodiment the well layer is made of a compound semiconductor containing antimony (Sb) additionally as a V group element.

The construction of the device fabricated in this embodiment is the same as that described in Embodiment 1 referring to FIGS. 1A to 1C and 2A to 2C, except that undoped GaAsSbN is used as the material for the well layer 14a. The same substrate and crystal growth method as those described in Embodiment 1 are employed. In this embodiment, the specific composition of GaAsSbN used for the well layer is $GaAs_{0.3(1-y)}Sb_{0.1(1-y)}N_y$.

Hereinbelow, the fabrication method and construction in this embodiment will be described in detail.

The outermost surface of the GaAs (100) substrate processed as shown in FIG. 1A includes {311} A plane exposed on the side walls of the grooves along the length of the grooves, in addition to the principal (100) plane. When materials including As, Sb, and N as V group elements are grown on such a substrate, the N mole fraction in portions grown on {311} A plane is slightly larger than that in portions grown on the principal (100) plane. Referring to FIGS. 2A and 2B, the N mole fraction (y) of GaAsSbN crystal as the well layer of the MQW portions 31 formed on the A plane is as large as about 0.03, and the forbidden bandwidth of the MQW is a value corresponding to a wavelength of about 1.55 µm. On the contrary, the N mole fraction of GaAsSbN crystal as the well layer of the MQW portions 33 formed on the principal (100) plane is as small as about 0.019, and the forbidden bandwidth of the MQW is a value corresponding to a wavelength of about 1.31 µm.

A distribution is generated in a lattice constant in correspondence with the distribution of the N mole fraction. However, crystal defect will not be induced from the lattice constant distribution since the distortion generated in the GaAsSbN layer is only about +0.2% for the portions 31 having an N mole fraction of about 0.03 and about +0.4% for the portions 33 having an N mole fraction of about 0.019, and the thickness of the GaAsSbN layer is smaller than a critical film thickness. When the MQW portion 31 shown in FIG. 2A is used for the active layer of the semiconductor laser element, and thus the MQW portion 33 shown in FIG. 2B is used for the core layer of the optical waveguide, light emitted from the semiconductor laser is allowed to propagate through the optical waveguide without being absorbed.

A current is applied to the semiconductor laser element of the thus-fabricated optical integrated device via the n-side electrode 17 and the p-side electrode 18. The current is narrowed by the current-narrowing layer 12 and flows into the V-shaped portion of the active layer, to realize laser oscillation having a threshold current of 10 mA and a wavelength of 1.55 µm. Since a conventional long-time high-temperature heat treatment is not required, no degradation in the device characteristics, such as an increase in the threshold current, is observed, compared with an independent semiconductor laser device having a similar configuration.

The core layer of the optical waveguide is formed on (100) plane while the active layer of the semiconductor laser is formed on a plane tilted in the A plane direction as described above. As a result, the optical waveguide is transparent to light emitted from the semiconductor laser, allowing the light to propagate therethrough without being excessively absorbed or scattered. The propagating light is efficiently retrieved at the other end face of the optical waveguide located away from the semiconductor laser. Since the light emitting layer of the light emitting element and the optical guide layer of the optical waveguide element are formed by simultaneous crystal growth as one continuous layer, no displacement or seam between the layers is observed, and excessive light loss or scattering is scarcely observed.

It can be understood that in this embodiment, alterations corresponding to the first and second alterations described in Embodiment 1 are possible.

Thus, substantially the same features on the crystal growth and the device construction as those described in Embodiment 1 with reference to FIG. 4 for the compound semiconductor material containing As and N as V group elements are obtained in Embodiments 6 and 7, which use the compound semiconductor material containing P and N as V group elements and that containing As, Sb, and N as V group elements, respectively. In Embodiments 6 and 7, only the cases of integrating the semiconductor laser element and the optical waveguide element were described. It can be understood that the compound containing P and N and the compound containing As, Sb, and N are also applicable to a laser having end face windows, an absorptive diffraction grating, and a gain diffraction grating as described in the preceding embodiments.

Embodiments 1 to 4, 6, and 7 exemplified the case that the waveguide structure formed on (100) plane and that formed on an A plane or a B plane were connected with each other. As is easily understood from FIG. 4, all the light emitting element, the light receiving element, and the optical waveguide element may be formed on A planes to obtain the effects as described above: The light emitting element and the light receiving element may be formed on an A plane having a larger tilt angle, while the optical waveguide element may be formed on another A plane having a smaller tilt angle. That is, (100) plane can be considered as an A plane having a tilt angle of 0°.

Likewise, all the light emitting element, the light receiving element, and the optical waveguide element can be formed on B planes to obtain the effects as described above: The light emitting element and the light receiving element may be formed on a B plane having a smaller tilt angle, while the optical waveguide element may be formed on another B plane having a larger tilt angle. That is, (100) plane can be considered as a B plane having a tilt angle of 0°. These are also applicable to the laser having end face windows and the GC-DFB-LD.

In Embodiments 1 to 4, 6, and 7, a simple optical waveguide element having a single passive waveguide was described. Alternatively, optical waveguide elements having a function such as branching, coupling, modulation, filtering, and spot size conversion may also be formed. It is also possible to form an individual device in which a semiconductor laser and a waveguide having a function of spot size conversion are integrated. Thus, according to the method of the present invention, a plurality of light emitting elements, a plurality of optical waveguide elements, and a plurality of light receiving elements can be easily integrated on one semiconductor substrate. An electric circuit for driving and controlling these elements can also be integrated on the same substrate.

In the above embodiments, specific combinations of the concave and convex shape formed on the substrate, the MQW structure, the oscillation wavelength, the waveguide structure, and the crystal growth method were described. The present invention is not limited to the exemplified specific combinations. In particular, although the compound containing As and N as V group elements in Embodiments 1 to 5, the compound containing P and N as V group elements in Embodiment 6, and the compound containing As, Sb, and N as V group elements in Embodiment 7 were used for the MQW well layer, the compound for the MQW well layer is not limited to such specific combinations and compositions as long as the compound contains N and at least one V group element other than N.

In the above embodiments, the GaAs substrate was used. Alternatively, a substrate made of any other III–V group material such as GaP, GaAsP, and GaInAs, a substrate made of a II–VI group material such as ZnSe and ZnS, a substrate made of a IV group material such as Si, Ge, and SiC, an insulating substrate made of sapphire and the like, an oxide substrate and the like, may be used. In particular, when an Si substrate and a GaP substrate are used, GaNAs and AlGaAsN which substantially lattice-match with the respective substrates can be used for the active layer.

As for the guide structure for stabilizing the transverse mode of the laser and the waveguide, an appropriate known structure may be used.

In the above description, the "upper" layer means that it is located farther from the substrate and the "lower" layer means that it is located closer to the substrate. The conductivity types of the substrate and thereby all the layers formed thereon may be inverted from those described in the above embodiments.

The crystal growth for fabricating the device of the present invention may be performed by a variety of known techniques. A variety of known techniques may be utilized for determination of types of impurities as dopants in the respective layers, the structure and fabrication method of the stripe-shaped waveguide, and the structure and fabrication method of the diffraction grating. A buffer layer may be appropriately formed between the substrate and the lower cladding layer, for example, to secure good crystallinity of the layers.

In the above embodiments, only the specific examples were shown for the method of processing the light output end face of the laser element, and the material and formation method of the coating. The construction of the laser device can easily be changed by adopting a variety of known techniques.

The Fabry-Perot type and the DFB type semiconductor laser elements were described in the above embodiments. Any other suitable types may also be used depending on the purpose of the use of the semiconductor optical integrated device. The semiconductor laser applicable in the present invention is not limited to the type which receives a current from top and bottom surfaces and emits laser light from an end face, but also includes a surface emission laser, a lateral injection type laser, an optical amplifier, and the like.

Thus, in a method for fabricating a semiconductor optical integrated device or a semiconductor laser device according to the present invention, portions having different forbidden bandwidths can be formed by one crystal growth step. Therefore, a light emitting element, a light receiving element, and an optical waveguide element can be integrated simultaneously to form the semiconductor optical integrated device without the necessity of high temperature heat treatment and complicated processing.

In another method for fabricating the semiconductor device according to the present invention, the change in the nitrogen mole fraction depending on the base crystal plane is intensified by supplying V group materials alternately. This allows for obtaining the above function more effectively.

According to the present invention, the core layers of the light emitting element, the light receiving element, and the optical waveguide element continue as one layer. This prevents an occurrence of displacement or seam between the layers. Therefore, a semiconductor optical integrated device with a reduced excessive light loss can be fabricated.

In still another method for fabricating a semiconductor laser device according to the present invention, portions having different forbidden bandwidths can be formed at the end faces and in the center of the device by one crystal growth step. This makes it possible to fabricate the semiconductor optical integrated device provided with window structures at the end faces thereof by one crystal growth step without the necessity of high-temperature heat treatment and complicated processing.

In still another method for fabricating a semiconductor laser device according to the present invention, periodic portions having different forbidden bandwidths can be formed by one crystal growth step. Thus, a semiconductor optical integrated device having an absorption periodic structure can be obtained without the necessity of high-temperature heat treatment and complicated processing.

In still another method for fabricating a semiconductor laser device according to the present invention, periodic portions having different forbidden bandwidths can be formed by one crystal growth step. Thus, a semiconductor optical integrated device having a gain periodic structure can be obtained without the necessity of high-temperature heat treatment and complicated processing.

According to the present invention, a fabrication method suitable for simultaneously fabricating a light emitting element, a light receiving element, and an optical waveguide element is provided.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A method for fabricating a semiconductor device comprising the step of:

forming a first compound semiconductor layer by crystal growth on a surface of a semiconductor substrate which includes a plurality of crystal planes having different orientations exposed due to a concave portion and/or a convex portion formed on the semiconductor substrate, the first compound semiconductor layer containing nitrogen and a V group element other than nitrogen.

2. A method for fabricating a semiconductor device according to claim 1, wherein the step of forming a first compound semiconductor layer includes the step of supplying a material of nitrogen and a material of the V group element other than nitrogen alternately.

3. A method for fabricating a semiconductor device according to claim 1, wherein the step of forming a first compound semiconductor layer includes the step of controlling the composition ratio of nitrogen to the V group element other than nitrogen depending on the difference in the orientation of the crystal planes.

4. A method for fabricating a semiconductor device according to claim 1, wherein the first compound semiconductor layer comprises a well layer of a quantum well structure.

5. A method for fabricating a semiconductor device according to claim 1, wherein the V group element other than nitrogen is at least one type selected from the group consisting of arsenic, phosphorus, and antimony.

6. A method for fabricating a semiconductor optical integrated device according to claim 1, comprising at least one light emitting element and/or a light receiving element and an optical waveguide element which are integrated on one substrate, wherein both a core layer of the light emitting element and/or the light receiving element and a core layer of the optical waveguide element include the first compound semiconductor layer, and a nitrogen mole fraction of the first compound semiconductor layer is larger in the light emitting element and/or the light receiving element than in the optical waveguide element.

7. A method for fabricating a semiconductor optical integrated device according to claim 6 wherein the light emitting element and/or the light receiving element and the optical waveguide element are formed on a substrate having planes selected from planes tilted from (100) plane in an A direction (a [011] direction) by an angle in a range of 0 to 55° and planes crystallographically equivalent to such planes, the light emitting element and/or the light receiving element being formed on one of the planes having a larger tilt angle and the optical waveguide element being formed on another of the planes having a smaller tilt angle.

8. A method for fabricating a semiconductor optical integrated device according to claim 6, wherein the light emitting element and/or the light receiving element and the optical waveguide element are formed on a substrate having planes selected from planes tilted from (100) plane in a B direction (a [0–11] direction) by an angle in a range of 0 to 55° and planes crystallographically equivalent to such planes, the light emitting element and/or the light receiving element being formed on one of the planes having a smaller tilt angle and the optical waveguide being formed on another of the planes having a larger tilt angle.

9. A method for fabricating a semiconductor laser device according to claim 1, wherein an active layer of the semiconductor laser device includes the first compound semiconductor layer, and a nitrogen mole fraction of the first compound semiconductor layer is larger in an end face portion of a resonator than in the center portion of the resonator in the resonator direction.

10. A method for fabricating a semiconductor laser device according to claim 9, wherein the semiconductor laser device is formed on a substrate having planes selected from planes tilted from (100) plane in an A direction (a [011] direction) by an angle in a range of 0 to 55° and planes crystallographically equivalent to such planes, and the center portion of the first compound semiconductor layer is formed on one of the planes having a larger tilt angle while the end face portion of the first compound semiconductor layer is formed on another of the planes having a smaller tilt angle.

11. A method for fabricating a semiconductor laser device according to claim 9, wherein the semiconductor laser device is formed on a surface of a substrate having planes selected from planes tilted from (100) plane in a B direction (a [0–11] direction) by an angle in a range of 0 to 55° and planes crystallographically equivalent to such planes, and the center portion of the first compound semiconductor layer is formed on one of the planes having a smaller tilt angle while the end face portion of the first compound semiconductor layer is formed on another of the planes having a larger tilt angle.

12. A method for fabricating a semiconductor laser device according to claim 1, wherein the first compound semiconductor layer is formed on a diffraction grating made of periodic concave and convex portions in the vicinity of an active layer, the first compound semiconductor layer tracing the concave and convex portions, a nitrogen mole fraction of the first compound semiconductor layer periodically changes in correspondence with the periodic concave and convex portions of the diffraction grating, and portions of the first compound semiconductor layer having a larger nitrogen mole fraction absorb light from the active layer, to establish an absorptive diffraction grating which generates periodic modulation of gain.

13. A method for fabricating a semiconductor laser device according to claim 1, wherein the first compound semiconductor layer is formed on a diffraction grating made of periodic concave and convex portions, the first compound semiconductor layer tracing the concave and convex portions, and a nitrogen mole fraction of the first compound semiconductor layer periodically changes in correspondence with the periodic concave and convex portions of the diffraction grating, to generate periodic modulation of a gain of an active layer.

14. A method for fabricating a semiconductor laser device, comprising the step of:

producing an absorptive diffraction grating by forming a diffraction grating made of periodic concave and convex portions in the vicinity of an active layer; and forming at least one first compound semiconductor layer containing nitrogen and a V group element other than nitrogen above the diffraction grating so that the concave and convex portions of the diffraction grating are traced.

15. A method for fabricating a semiconductor optical integrated device according to claim 14, wherein the semiconductor optical integrated device is fabricated simultaneously with other elements constituting the semiconductor optical integrated device.

16. A method for fabricating a semiconductor laser device, comprising the step of:

producing a gain diffraction grating by forming a diffraction grating made of periodic concave and convex portions and forming at least one first compound semiconductor layer containing nitrogen and a V group element other than nitrogen above the diffraction grating so that the concave and convex portions of the diffraction grating are traced.

17. A method for fabricating a semiconductor optical integrated device according to claim 16, wherein the semiconductor optical integrated device is fabricated simultaneously with other elements constituting the semiconductor optical integrated device.

18. A method for fabricating a semiconductor optical integrated device, comprising the step of:

forming a core layer and an upper cladding layer composed of at least one layer sequentially by crystal growth on a surface of a semiconductor substrate which includes a plurality of crystal planes having different orientations exposed due to a concave portion and/or a convex portion formed on the semiconductor substrate, the core layer including at least one first compound semiconductor layer containing nitrogen and a V group element other than nitrogen.

19. A method for fabricating a semiconductor optical integrated device according to claim 18, wherein the plurality of crystal planes are selected from planes tilted from (100) plane in an A direction (a [011] direction) by an angle in a range of 0 to 55° and planes crystallographically equivalent to such planes, and an optical waveguide element is formed on a plane having a smaller tilt angle while a light emitting element and/or a light receiving element are formed on a plane having a larger tilt angle.

20. A method for fabricating a semiconductor optical integrated device according to claim 18, wherein the plurality of crystal planes are selected from planes tilted from (100) plane in a B direction (a [0–11] direction) by an angle in a range of 0 to 55° and planes crystallographically equivalent to such planes, and an optical waveguide element is formed on a plane having a larger tilt angle while a light emitting element and/or a light receiving element are formed on a plane having a smaller tilt angle.

21. A method for fabricating a semiconductor optical integrated device, comprising the steps of:

forming at least one set of continuous grooves or mesas on a semiconductor substrate having {100} plane as a principal plane, side walls of the continuous grooves or mesas being made of a plane tilted from (100) plane in an a direction (a [0–11] direction) by an angle in a range of 0 to 55° or a plane crystallographically equivalent to such a plane, the continuous grooves or mesas having substantially the same depth and different widths;

forming a waveguide structure by sequentially forming by crystal growth a lower cladding layer composed of at least one layer, a core layer, and an upper cladding layer composed of at least one layer, the core layer including at least one first compound semiconductor layer containing nitrogen and a V group element other than nitrogen;

forming a light emitting element and/or a light receiving element using a portion of the waveguide structure located above the groove or mesa having a smaller width; and forming an optical waveguide element using a portion of the waveguide structure located above the groove or mesa having a larger width.

22. A method for fabricating a semiconductor optical integrated device, comprising the steps of:

forming at least one set of continuous grooves or mesas on a semiconductor substrate having {100} plane as a principal plane, side walls of the continuous grooves or mesas being made of a plane tilted from (100) plane in a B direction (a [0–11] direction) by an angle in a range of 0 to 55° or a plane crystallographically equivalent to such a plane, the continuous grooves or mesas having substantially the same depth and different widths;

forming a waveguide structure by sequentially forming by crystal growth a lower cladding layer composed of at least one layer, a core layer, and an upper cladding layer composed of at least one layer, the core layer including at least one first compound semiconductor layer containing nitrogen and a V group element other than nitrogen;

forming a light emitting element and/or a light receiving element using a portion of the waveguide structure located above the groove or mesa having a larger width; and forming an optical waveguide element using a portion of the waveguide structure located above the groove or mesa having a smaller width.

23. A method for fabricating a semiconductor laser device, comprising the step of:

forming a lower cladding layer composed of at least one layer, an active layer, and an upper cladding layer composed of at least one layer sequentially on a semiconductor substrate by crystal growth, the active layer including at least one first compound semiconductor layer containing nitrogen and a V group element other than nitrogen, the substrate having a convex portion and/or a concave portion to expose a plurality of crystal planes having orientations different between end face portions and a center portion in a resonator direction.

24. A method for fabricating a semiconductor laser device according to claim 23, wherein the plurality of crystal planes are at least selected from planes tilted from (100) plane in an A direction (a [011] direction) by an angle in a range of 0 to 55° and planes crystallographically equivalent to such planes, and the crystal plane in the end face portions has a smaller tilt angle while the crystal plane in the center portion has a larger tilt angle.

25. A method for fabricating a semiconductor laser device according to claim 23, wherein the plurality of different crystal planes are at least selected from planes tilted from (100) plane in a B direction (a [0–11] direction) by an angle in a range of 0 to 55° and planes crystallographically equivalent to such planes, and the crystal plane in the end face portions has a larger tilt angle while the crystal plane in the center portion has a smaller tilt angle.

26. A method for fabricating a semiconductor optical integrated device according to claim 23, wherein the semiconductor optical integrated device is fabricated simultaneously with other elements constituting the semiconductor optical integrated device.

* * * * *